(12) United States Patent
Lee

(10) Patent No.: US 9,196,658 B2
(45) Date of Patent: Nov. 24, 2015

(54) SEMICONDUCTOR DEVICE AND METHOD FOR FABRICATING THE SAME, AND MICROPROCESSOR, PROCESSOR, SYSTEM, DATA STORAGE SYSTEM AND MEMORY SYSTEM INCLUDING THE SEMICONDUCTOR DEVICE

(71) Applicant: SK HYNIX INC., Icheon (KR)

(72) Inventor: Jae-Yeon Lee, Icheon (KR)

(73) Assignee: SK HYNIX INC., Icheon (KR)

( * ) Notice: Subject to any disclaimer, the term of this patent is extended or adjusted under 35 U.S.C. 154(b) by 1 day.

(21) Appl. No.: 13/945,581

(22) Filed: Jul. 18, 2013

(65) Prior Publication Data

US 2014/0312294 A1   Oct. 23, 2014

(30) Foreign Application Priority Data

Apr. 23, 2013   (KR) .................. 10-2013-0044949

(51) Int. Cl.
*H01L 27/24* (2006.01)
*H01L 45/00* (2006.01)

(52) U.S. Cl.
CPC ........ *H01L 27/2481* (2013.01); *H01L 27/2463* (2013.01); *H01L 45/165* (2013.01); *H01L 45/08* (2013.01); *H01L 45/1233* (2013.01); *H01L 45/146* (2013.01); *H01L 45/1675* (2013.01)

(58) Field of Classification Search
None
See application file for complete search history.

(56) References Cited

U.S. PATENT DOCUMENTS

2004/0051094 A1* 3/2004 Ooishi ............................. 257/5
2006/0054950 A1* 3/2006 Baek et al. ................. 257/295
2006/0197115 A1* 9/2006 Toda ............................ 257/248

FOREIGN PATENT DOCUMENTS

KR   10-2000-0041239 A   7/2000
KR   10-2012-0004847 A   1/2012

* cited by examiner

*Primary Examiner* — Andres Munoz

(57) ABSTRACT

A method for fabricating a semiconductor device includes forming a first conductive pattern and a first pad over a substrate; forming a first and a second resistance variable elements over the first conductive pattern and the first pad, respectively; performing impurity doping into the second resistance variable element to produce a conductive contact; and forming a second conductive pattern over the first resistance variable element.

9 Claims, 16 Drawing Sheets

SEMICONDUCTOR DEVICE AND METHOD FOR FABRICATING THE SAME, AND MICROPROCESSOR, PROCESSOR, SYSTEM, DATA STORAGE SYSTEM AND MEMORY SYSTEM INCLUDING THE SEMICONDUCTOR DEVICE

CROSS-REFERENCE TO RELATED APPLICATION

The present application claims priority of Korean Patent Application No. 10-2013-0044949, filed on Apr. 23, 2013, which is incorporated by reference herein in its entirety.

BACKGROUND

1. Field

Embodiments of the present disclosure relate to a semiconductor device and a method for fabricating the same, and more particularly, to a semiconductor device which includes a resistance variable element to be switched between different resistance states according to an applied voltage or current, and a method for fabricating the same.

2. Description of the Related Art

Recently, as electronic devices become smaller in size with low power consumption, high performance, and multi-functionality, semiconductor devices capable of storing information in these small electronic devices (e.g., a computer, a portable communication device) have been developed. Such semiconductor devices which can store data use a resistance variable element to switch between different resistance states according to an applied voltage or current. For example, various semiconductor devices such as a Resistive Random Access Memory (RRAM), a Phase-change Random Access Memory (PRAM), a Ferroelectric Random Access Memory (FRAM), a Magneto-resistive Random Access Memory (MRAM), an E-fuse, etc. have been developed.

SUMMARY

Various embodiments are directed to a semiconductor device in which processing is easy and simple and which can increase the degree of integration, and a method for fabricating the same.

In an embodiment, a method for fabricating a semiconductor device may include: forming a first conductive pattern and a first pad over a substrate; forming a first and a second resistance variable elements over the first conductive pattern and the first pad, respectively; performing impurity doping into the second resistance variable element to produce a conductive contact; and forming a second conductive pattern over the first resistance variable element.

In an embodiment, a semiconductor device may include: a first conductive pattern; a second conductive pattern disposed over the first conductive pattern; a resistance variable element interposed between the first conductive pattern and the second conductive pattern; a first pad which is provided on the same plane as the first conductive pattern; and a conductive contact disposed over the first pad, wherein the conductive contact is provided on the same plane as the resistance variable element and has substantially the same sidewall shape as the resistance variable element.

In an embodiment, a method for fabricating a semiconductor device may include: forming first lines over a substrate, the first lines extending in a first direction; forming resistance variable elements over the first lines such that the resistance variable elements are disposed at intersections of the first lines and second lines; performing impurity doping into at least one of the resistance variable elements to form an insulating pattern; and forming the second lines over the resistance variable elements and the insulating pattern, the second lines extending in a second direction crossing with the first direction.

In an embodiment, a semiconductor device may include: first lines extending in a first direction; second lines disposed over the first lines and extending in a second direction crossing with the first direction; one or more insulating patterns interposed between the first lines and the second lines and disposed at one or more intersections of the first lines and the second lines; and resistance variable elements interposed between the first lines and the second lines and disposed at the rest of the intersections of the first lines and the second lines.

In an embodiment, a microprocessor may include: a control unit configured to receive a signal including an external command, and to perform extraction, decoding, and controlling of input and output of the external command; an operation unit configured to perform an operation in response to a signal of the control unit; and a memory unit configured to store any of (i) data for performing the operation, (ii) data corresponding to a result of performing the operation, and (iii) an address of data for which the operation is performed, wherein the memory unit comprises: a first conductive pattern; a second conductive pattern disposed over the first conductive pattern; a resistance variable element interposed between the first conductive pattern and the second conductive pattern; a first pad which is provided on the same plane as the first conductive pattern; and a conductive contact disposed over the first pad, wherein the conductive contact is provided on the same plane as the resistance variable element and has substantially the same sidewall shape as the resistance variable element.

In an embodiment, a processor may include: a core unit configured to perform, in response to an external command, an operation corresponding to the external command, by using data; a cache memory unit configured to store any of (i) data for performing the operation, (ii) data corresponding to a result of performing the operation, and (iii) an address of data for which the operation is performed; and a bus interface connected between the core unit and the cache memory unit, and configured to transmit data between the core unit and the cache memory unit, wherein the cache memory unit comprises: a first conductive pattern; a second conductive pattern disposed over the first conductive pattern; a resistance variable element interposed between the first conductive pattern and the second conductive pattern; a first pad which is provided on the same plane as the first conductive pattern; and a conductive contact disposed over the first pad, wherein the conductive contact is provided on the same plane as the resistance variable element and has substantially the same sidewall shape as the resistance variable element.

In an embodiment, a system may include: a processor configured to decode a command inputted from outside and control an operation for information according to a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between (i) at least one of the processor, the auxiliary memory device and the main memory device and (ii) the outside, wherein at least one of the auxiliary memory device and the main memory device comprises:

a first conductive pattern; a second conductive pattern disposed over the first conductive pattern; a resistance variable element interposed between the first conductive pattern and the second conductive pattern; a first pad which is provided on the same plane as the first conductive pattern; and a conductive contact disposed over the first pad, wherein the conductive contact is provided on the same plane as the resistance variable element and has substantially the same sidewall shape as the resistance variable element.

In an embodiment, a data storage system may include: a storage device configured to store data and preserve stored data regardless of power supply; a controller configured to control input and output of data to and from the storage device in response to an external command received from outside; a temporary storage device configured to temporarily store data exchanged between the storage device and the outside; and an interface configured to perform communication between (i) at least one of the storage device, the controller, and the temporary storage device and (ii) the outside, wherein at least one of the storage device and the temporary storage device comprises: a first conductive pattern; a second conductive pattern disposed over the first conductive pattern; a resistance variable element interposed between the first conductive pattern and the second conductive pattern; a first pad which is provided on the same plane as the first conductive pattern; and a conductive contact disposed over the first pad, wherein the conductive contact is provided on the same plane as the resistance variable element and has substantially the same sidewall shape as the resistance variable element.

In an embodiment, a memory system may include: a memory configured to store data and preserve stored data regardless of power supply; a memory controller configured to control input and output of data to and from the memory in response to an external command received from outside; a buffer memory configured to buffer data exchanged between the memory and the outside; and an interface configured to perform communication between (i) at least one of the memory, the memory controller, and the buffer memory and (ii) the outside, wherein at least one of the memory and the buffer memory comprises: a first conductive pattern; a second conductive pattern disposed over the first conductive pattern; a resistance variable element interposed between the first conductive pattern and the second conductive pattern; a first pad which is provided on the same plane as the first conductive pattern; and a conductive contact disposed over the first pad, wherein the conductive contact is provided on the same plane as the resistance variable element and has substantially the same sidewall shape as the resistance variable element.

DETAILED DESCRIPTION

Figure 1A:
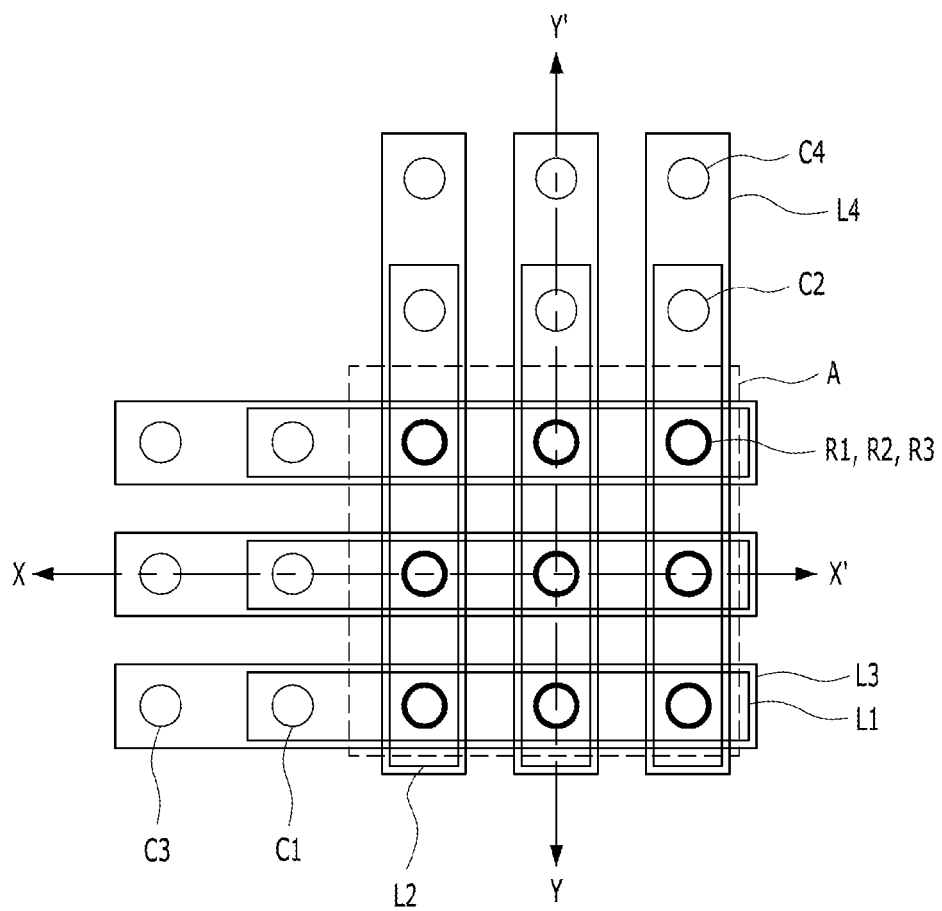
FIGS. 1A and 1B are views explaining a semiconductor device in accordance with an example and a method for fabricating the same.

Various embodiments will be described below in more detail with reference to the accompanying drawings. The present disclosure may, however, include embodiments in different forms and should not be construed as limited to the embodiments set forth herein. Rather, these embodiments are provided so that this disclosure will be thorough and complete, and will fully convey the scope of the present disclosure to those skilled in the art. Throughout the disclosure, like reference numerals refer to like parts throughout the various figures and embodiments of the present disclosure.

The drawings are not necessarily to scale and in some instances, proportions may have been exaggerated in order to clearly illustrate features of embodiments. When a first layer is referred to as being "on" a second layer or "on" a substrate, it not only refers to a case where the first layer is formed directly on the second layer or the substrate but also a case where a third layer exists between the first layer and the second layer or the substrate.

Prior to explaining embodiments of the present disclosure, an example will be described in order to show features of these embodiments clearly.

Figure 1B:
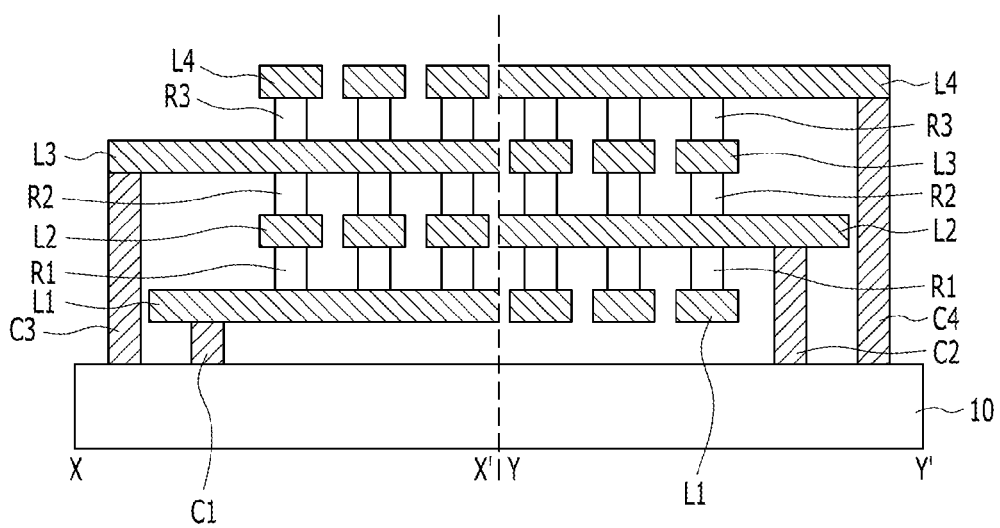

FIGS. 1A and 1B are views explaining a semiconductor device in accordance with an example and a method for fabricating the same. More specifically, FIG. 1A is a plan view and FIG. 1B is a cross-sectional view taken along a line X-X' and a line Y-Y' of FIG. 1B.

Referring to FIGS. 1A and 1B, a cross-point structure includes a lower line, an upper line crossing with the lower line, and a resistance variable element interposed between the lower line and the upper line. The cross-point structure is disposed over a substrate 10 having a predetermined lower structure (not shown) formed therein. A plurality of cross-point structures may be stacked over the substrate 10 in a vertical direction.

Specifically, a first cross-point structure includes first lines L1 extending in a first direction (i.e., the direction of the line X-X' of FIG. 1A), second lines L2 extending in a second direction (i.e., the direction of the line Y-Y' of FIG. 1A) crossing with the first direction, and first resistance variable elements R1 disposed between the first lines L1 and the second lines L2 at intersections of the first lines L1 and the second lines L2. The first lines L1 and the second lines L2 are disposed over the substrate 10. In the first cross-point structure, the first lines L1 may be disposed over the second lines L2, so that the first lines L1 may be lower lines and the second lines L2 may be upper lines.

A second cross-point structure includes the second lines L2, third lines L3 extending in the first direction and disposed over the second lines L2, and second resistance variable elements R2 disposed between the second lines L2 and the third lines L3 at intersections of the second lines L2 and the third lines L3. The second cross-point structure may be disposed over the first cross-point structure. In the second cross-point structure, the second lines L2 may be lower lines, while the second lines L2 may be upper lines in the first cross-point structure. In this case, the first cross-point structure and the second cross-point structure shares the second lines L2.

A third cross-point structure includes the third lines L3, fourth lines L4 extending in the second direction and disposed over the third lines L3, and third resistance variable elements R3 disposed between the third lines L3 and the fourth lines L4. The third cross-point structure may be disposed over the second cross-point structure. The second cross-point structure and the third cross-point structure may share the third lines L3 as upper lines and lower lines, respectively.

In the example, three cross-point structures are shown. However, the number of the cross-point structures may vary. Also, in the example, each of cross-point structures includes three lower lines and three upper lines, thereby including 3*3 resistance variable elements disposed at 9 intersections of the lower and upper lines. However, the numbers of the lower lines, the upper lines and the resistance variable elements included in each of the cross-point structures may vary.

In the first to the third cross point structures, each of the first to the fourth lines L1, L2, L3 and L4 may be connected with a control element (not shown). The control element is formed in the substrate 10 and controls an operation of the connected line L1, L2, L3 or L4. For example, although not shown in the figure, the control element may be a transistor formed in the substrate 10. In this case, a first transistor formed in the substrate 10 is connected with the first line L1 and control the operation of the first line L1. Similarly, second to fourth transistors formed in the substrate 10 are connected with the second to the fourth lines L2, L3 and L4 and control operations of the second to the fourth lines L2, L3 and L4, respectively. The substrate 10 may further include various elements except for the transistors. Also, each of the first to the fourth lines L1, L2, L3 and L4 may be controlled by some elements except for the transistors. The first to the fourth lines L1, L2, L3 and L4 may be connected with different parts of the substrate 10 through conductive contacts which are placed at different locations, thereby being controlled separately. Hereinafter, conductive contacts between the first lines L1 and the substrate 10 are referred to as first line contacts C1, conductive contacts between the second lines L2 and the substrate 10 are referred to as second line contacts C2, conductive contacts between the third lines L3 and the substrate 10 are referred to as third line contacts C3, and conductive contacts between the fourth lines L4 and the substrate 10 are referred to as fourth line contacts C4.

The first to the fourth line contacts C1, C2, C3 and C4 may be located in the outside of an array region A as shown in FIG. 1A. In the array region A, the first to the third resistance variable elements R1, R2 and R3 are disposed and overlap with portions of the first to the fourth lines L1, L2, L3 and L4. Here, while the first lines L1 and the third lines L3 extend in the same direction and overlap with each other, the overlap does not occur at end portions of the third lines L3. This is because the end portions of the third lines L3 protrude more than those of the first lines L1 in the first direction. The end portions of the third lines L3 may be used to form the third line contacts C3. Similarly, while the second lines L2 and the fourth lines L4 extend in the same direction and overlap with each other, end portions of the fourth lines L4 does not overlap with end portions of the second lines L2. The end portions of the fourth lines L4 may be used to form the fourth line contacts C4.

Although not shown in the figure, spaces between the first to the fourth line contacts C1, C2, C3 and C4, the first to the fourth lines L1, L2, L3 and L4, and the first to the third resistance variable elements R1, R2 and R3 may be filled with an insulating material.

In the process of fabricating the semiconductor device in accordance with the example, the following issues described below may arise.

For example, the second line contacts C2 may be formed by performing the following processes: (i) forming the first lines L1 and the first resistance variable elements R1, (ii) filling remaining spaces with an insulating layer, (iii) forming contact holes for forming the second line contacts C2 by selectively etching the insulating layer, (iv) filling the contact holes with a conductive material by deposition of the conductive material, and (v) forming the second line contacts C2 by planarization of the deposited conductive material. However, forming of the second line contacts C2 may be complex processes. Specifically, masking and etching processes for forming the contact holes may be called for in addition to masking and etching processes for forming the first lines L1 and the first resistance variable elements R1. As a result, processing time and manufacturing cost may increase. In addition, a plane area of each of the second line contacts C2 is small. Since masking and etching processes for forming these small contact holes may be difficult, production yield could decrease. Similar issues may arise when the third and the fourth line contacts C3 and C4 are formed.

Furthermore, as a number of the cross-point structures increases, it is more difficult to form line contacts which connect upper lines of a cross-point structure formed on a plane at a large distance from a substrate. For example, when the fourth line contacts C4 are formed, an etching depth for the formation of the contact holes C4 is large and may result in poor etching performance. Therefore, it is difficult to increase the number of the cross-point structures formed over the substrate, which would limit increasing the degree of integration.

Embodiments of the present disclosure which will be described below may address issues arising from the example.

FIGS. 2A to 7B are views explaining a semiconductor device in accordance with an embodiment and a method for fabricating the same. More specifically, FIGS. 2A, 3A, 4A, 5A, 6A and 7A are plan views, and FIGS. 2B, 3B, 4B, 5B, 6B and 7B are cross-sectional views taken along lines X-X' and lines Y-Y' of FIGS. 2A, 3A, 4A, 5A, 6A and 7A, respectively. In this embodiment, three cross-point structures will be described, similarly to the example of FIGS. 1A and 1B. However, embodiments are not so limited, and may be applicable to form one cross-point structure, two cross-point structures, or four or more cross-point structures.

First, the method for fabricating a semiconductor device of this embodiment will be described.

Figure 2A:
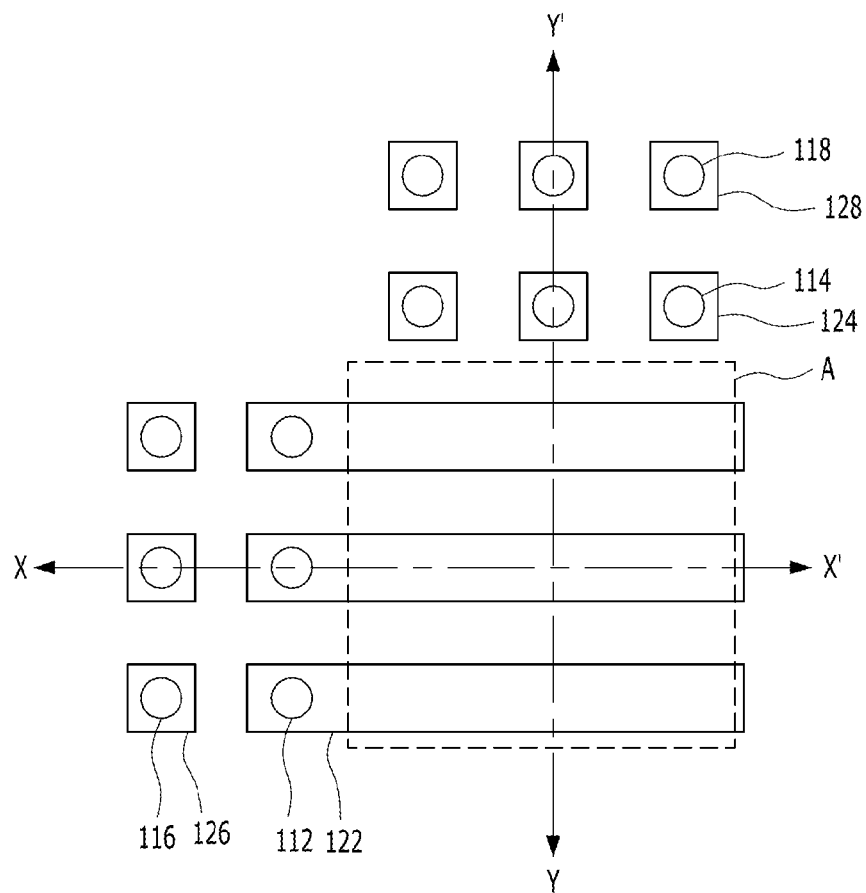
FIGS. 2A to 7B are views explaining a semiconductor device in accordance with an embodiment and a method for fabricating the same.
Figure 2B:
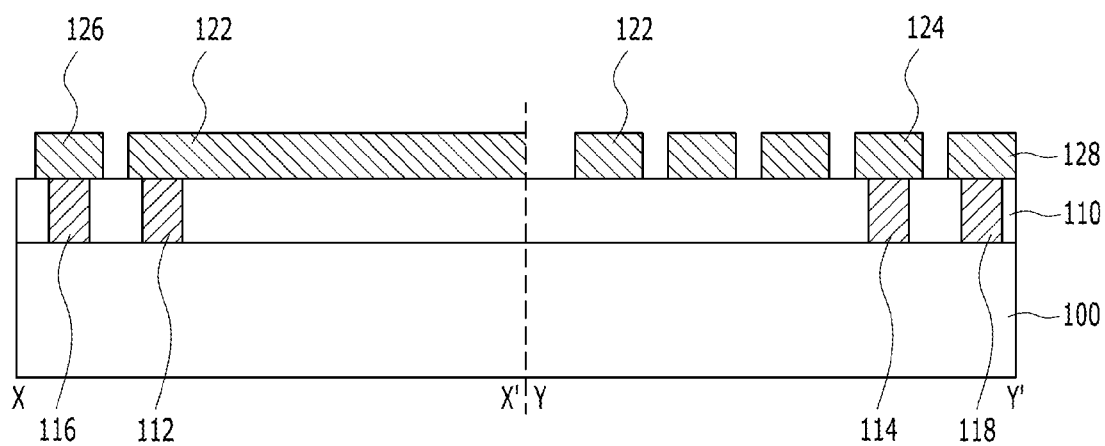

Referring to FIGS. 2A and 2B, a substrate 100 having a predetermined lower structure (not shown) such as a transistor is provided.

A first interlayer insulating layer 110 may be formed over the substrate 100. The first interlayer insulating layer 110 may be formed of an insulating material such as an oxide.

A first conductive contact 112, a second conductive contact 114, a third conductive contact 116, and a fourth conductive contact 118 which penetrate the first interlayer insulating layer 110 may be formed. The first to the fourth conductive contacts 112, 114, 116 and 118 may be connected with parts of the substrate 100. For example, the first to the fourth conductive contacts 112, 114, 116 and 118 may be connected with transistors (not shown) formed in the substrate 100. The first to the fourth conductive contacts 112, 114, 116 and 118 may be formed by forming a mask pattern (now shown) to expose regions where the first to the fourth conductive contacts 112, 114, 116 and 118 are to be formed over the first interlayer insulating layer 110, forming contact holes by etching the first interlayer insulating layer 110 using the mask pattern as an etch barrier until the substrate 100 are exposed, and filling the contact holes with a conductive material such as a metal, a metal nitride, etc.

The first to the fourth conductive contacts 112, 114, 116 and 118 may be located in regions where the first to the fourth line contacts C1, C2, C3 and C4 of the example of FIGS. 1A and 1B are to be formed, respectively. Therefore, the first to the fourth conductive contacts 112, 114, 116 and 118 may be located in the outside of an array region A where resistance variable elements are disposed. In this embodiment, the first and the third conductive contacts 112 and 116 may be disposed at one side, for example, a left side of the array region A. The third conductive contacts 116 may be disposed further away from the array region A compared with the first conductive contacts 112 in the first direction. Also, the second and the fourth conductive contacts 114 and 118 may be disposed at another side, for example, an upper side of the array region A, and the fourth conductive contacts 118 may be disposed further away from the array region A compared with the second conductive contacts 114 in the second direction.

Then, a first to a fourth conductive patterns 122, 124, 126 and 128 which are connected with the first to the fourth conductive contacts 112, 114, 116 and 118, respectively, are formed. The first to the fourth conductive patterns 122, 124, 126 and 128 may be formed by forming a conductive layer over the first interlayer insulating layer 110 and the first to the fourth conductive contacts 112, 114, 116 and 118, and patterning the conductive layer. The conductive layer may be a single layer or a multiple layer including various conductive materials such as a metal, a metal nitride, etc.

The first conductive patterns 122 may have a line shape and extend in the first direction to cross the array region A. End portions of the first conductive patterns 122 may be located in the outside of the array region A and overlap with the first conductive contacts 112, so that the end portions are electrically connected with the first conductive contacts 112. In this case, the first conductive patterns 122 may be substantially the same as the first lines L1 of the example of FIGS. 1A and 1B, and the first conductive contacts 112 may be substantially the same as the first line contacts C1 of the example.

The second to the fourth conductive patterns 124, 126 and 128 may have an island shape and overlap with the second to the fourth conductive contacts 114, 116 and 118, respectively. Furthermore, plane areas of the second to the fourth conductive patterns 124, 126 and 128 may be larger than those of the second to the fourth conductive contacts 114, 116 and 118, respectively. The second to the fourth conductive patterns 124, 126 and 128 may function as a pad which facilitates connections between lower conductive contacts disposed under the pad and upper conductive contacts disposed over the pad.

Figure 3A:
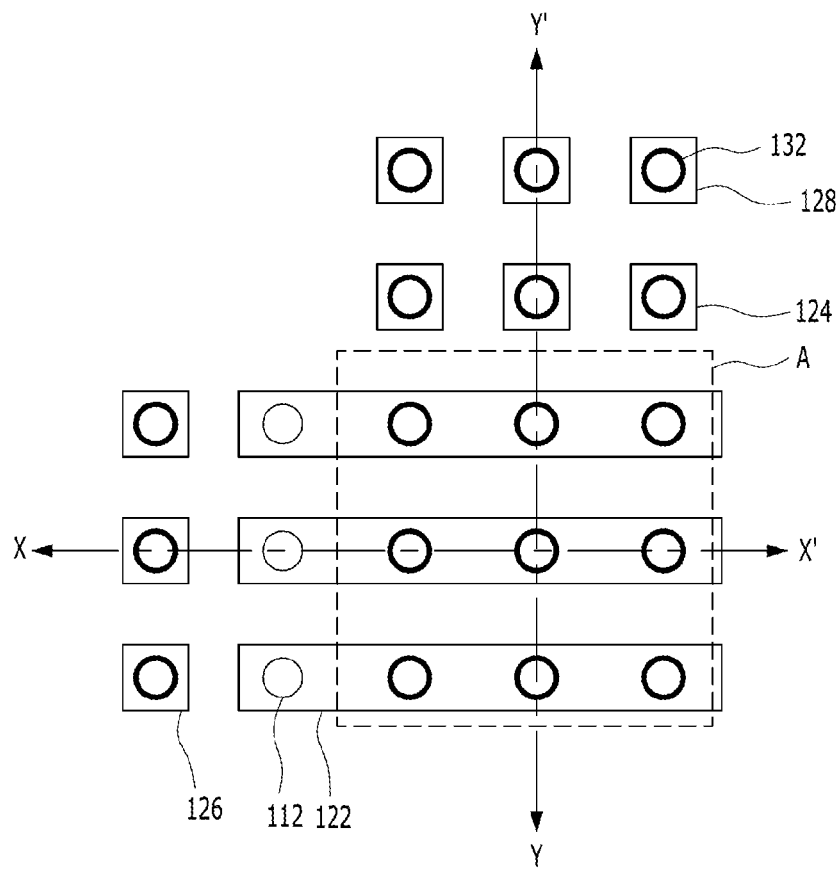
Figure 3B:
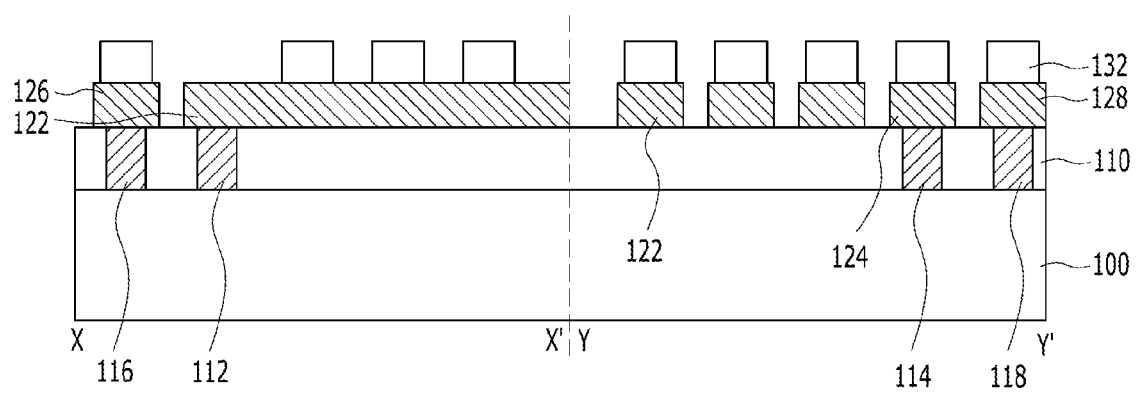

Referring to FIGS. 3A and 3B, first resistance variable elements 132 having an island shape are formed over the first to the fourth conductive patterns 122, 124, 126 and 128. The first resistance variable elements 132 formed over the first conductive patterns 122 may be disposed at intersections of the first conductive patterns 122 and second lines 144 (see FIG. 5A), as will be described below. Therefore, the first resistance variable elements 132 may be arranged along the first and the second directions in a matrix form in the array region A. On the other hand, the first resistance variable elements 132 formed over the second to the fourth conductive patterns 124, 126 and 128 correspond to each of the second to the fourth conductive patterns 124, 126 and 128.

The first resistance variable elements 132 may be switched between different resistance states according to an applied voltage or current through the first conductive patterns 122 and the second lines 144 (see FIG. 5A) which will be described below, thereby storing data. For example, data '0' or '1' may be stored according to whether each of the first resistance variable elements 132 is in a high resistance state or a low resistance state. The first resistance variable elements 132 may have a single layer or a multiple-layer structure and include a material used in an RRAM, a PRAM, an FRAM, an MRAM, and the like. For example, the material may include a metal oxide such as a perovskite-based material, a transition metal oxide and the like, a phase-change material such as a chalcogenide-based material, a ferroelectric material, a ferromagnetic material, and the like.

For example, when the first resistance variable elements 132 are used in the RRAM, each of the first resistance variable elements 132 may include an oxygen-rich metal oxide layer which is relatively rich in oxygen and an oxygen-deficient metal oxide layer which is relatively deficient in oxygen and includes a large amount of oxygen vacancies. In an embodiment, the oxygen-rich metal oxide layer may be a layer which satisfies a stoichiometric ratio such as $TiO_2$ and $Ta_2O_5$. In this case, the oxygen-deficient metal oxide layer may be a layer which is deficient in oxygen when compared to the oxygen-rich metal oxide layer such as $TiO_x$ (x<2) and $TaO_y$ (y<2.5). When a voltage or current is applied to the first resistance variable element 132, oxygen ions in the oxygen-rich metal oxide layer migrate to the oxygen-deficient metal oxide layer, and oxygen vacancies are introduced into the oxygen-rich metal oxide layer. As a result a current path by oxygen vacancies may be created in the oxygen-rich metal oxide layer. When the oxygen ions in the oxygen-rich metal oxide layer do not migrate to the oxygen-deficient metal oxide layer sufficiently to form a current path, the current path (or filament) may not be created. In this manner, a current path may be created or eliminated in the oxygen-rich metal oxide layer based upon whether the oxygen-deficient metal oxide layer supplies enough oxygen vacancies to the oxygen-rich metal oxide layer to form the current path or not. Therefore each of the first resistance elements 132 shows a resistance variable characteristic. However, this embodiment is not so limited, and any materials or structures switched between different resistance states may be used as the first resistance variable elements 132.

Although not shown in the figure, an upper electrode or a lower electrode may be disposed over or under each of the first resistance variable elements 132. The upper electrode or the lower electrode may be formed of a conductive material such as a metal, a metal nitride, and the like. These electrodes may be patterned together with the first resistance variable elements 132 so that the upper electrode or the lower electrode has the same plane shape as the first resistance variable elements 132.

The first resistance variable elements 132 may be formed by depositing a material layer having a resistance variable characteristic (e.g., a double layer including the oxygen-rich metal oxide layer and the oxygen-deficient metal oxide layer over the resulting structure of FIGS. 2A and 2B), and patterning the material layer.

Figure 4A:
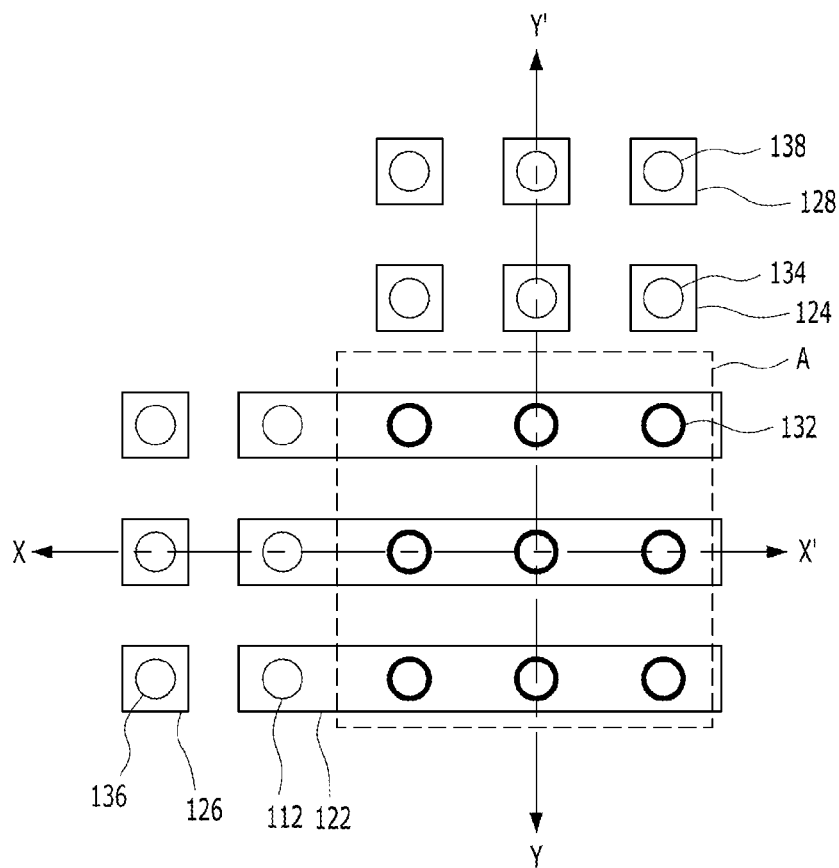
Figure 4B:
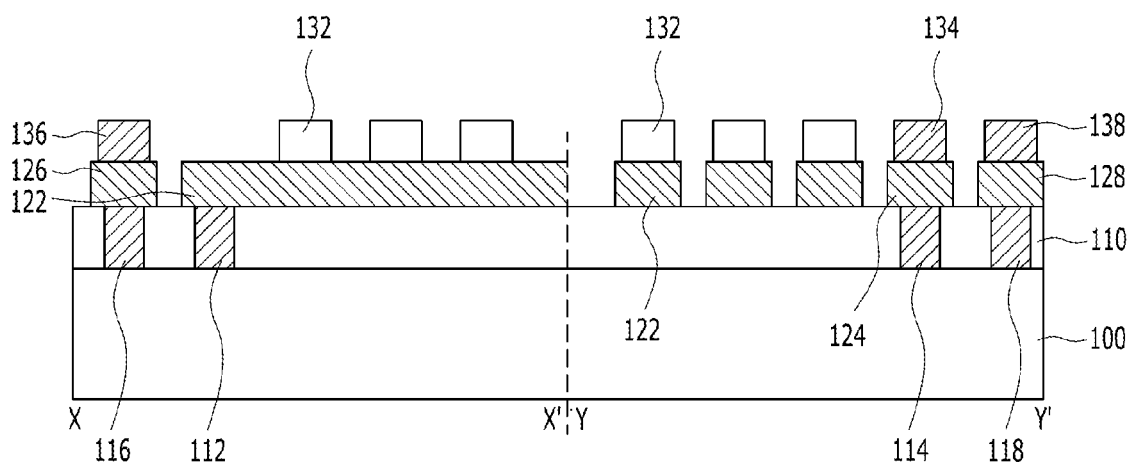

Referring to FIGS. 4A and 4B, the first resistance variable elements 132 disposed over the second to the fourth conductive patterns 124, 126 and 128 are changed to conductive materials. In an embodiment, impurity doping into the first resistance variable elements 132 disposed over the second to the fourth conductive patterns 124, 126 and 128 may be performed. Hereinafter, the first resistance variable elements 132 that are disposed over the second to the fourth conductive patterns 124, 126 and 128 and changed to conductive materials are referred to as fifth to seventh conductive contacts 134, 136 and 138. The fifth to the seventh conductive contacts 134, 136 and 138 have the same shape as the first resistance variable elements 132, while having different characteristics.

Here, the impurity doping may be performed by ion implantation such that a mask pattern covering the first resistance variable elements 132 is formed over the resulting structure of FIGS. 3A and 3B. For example, the mask pattern may cover the array region A.

Any impurities may be used in the impurity doping if the impurities can change the first resistance variable elements 132 to conductive materials. For example, when the first resistance variable elements 132 are formed of a metal oxide, the impurity doping may be performed by a metal ion implantation. When metal ions such as copper ions are implanted to the first resistance variable elements 132, the metal ions are combined with oxygen of the metal oxide. As a result, the density of oxygen vacancies in the first resistance variable elements 132 may be increased. In this case, a current path that has been created by oxygen vacancies may be maintained in the metal oxide. As a result, the first resistance variable elements 132 may not retain a resistance variable property, but have a conductive property imparted to them. The impurity doping may further include a heat treatment which is performed after the metal ion implantation. The heat treatment may be performed for various purposes including restoration of damaged microscopic structure of the fifth to the seventh conductive contacts 134, 136 and 138, and control of distribution of the implanted ions in the conductive contacts 134, 136 and 138. In this manner, the conductive property of the fifth to the seventh conductive contacts 134, 136 and 138 may be controlled.

When the upper electrode (not shown) is disposed over the first resistance variable elements 132, energy of implanted ions may be adjusted to be sufficiently high so that the implanted ions pass through the upper electrode and reach the first resistance variable elements 132.

Figure 5A:
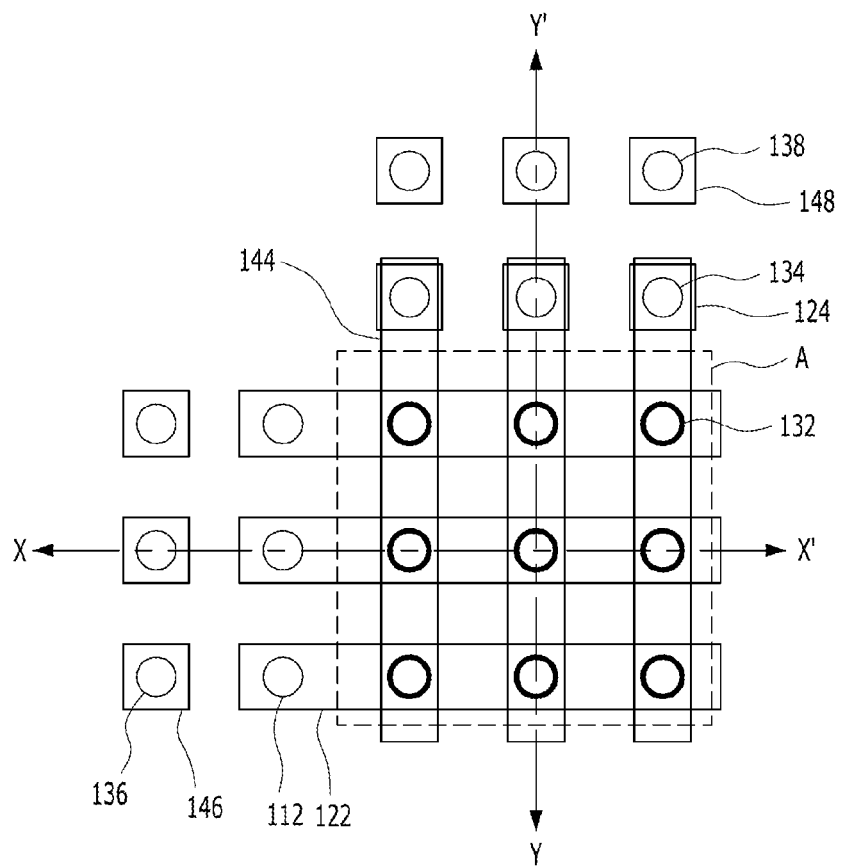
Figure 5B:
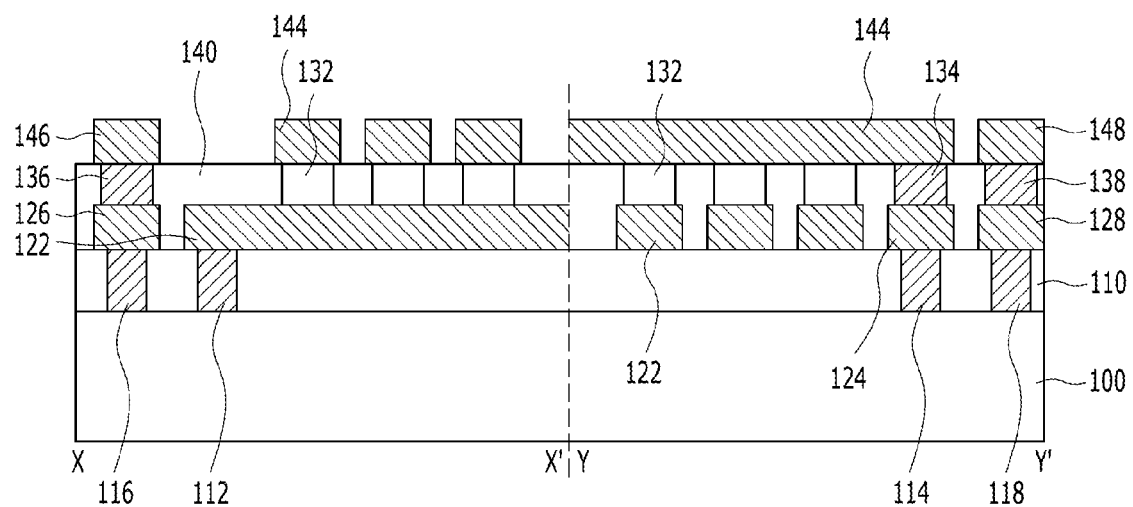

Referring to FIGS. 5A and 5B, a second interlayer insulating layer 140 fills a space between the first to the fourth conductive patterns 122, 124, 126 and 128, the first resistance variable elements 132, and the fifth to seventh conductive contacts 134, 136 and 138. The second interlayer insulating layer 140 may be formed of an insulating material such as an oxide. The second interlayer insulating layer 140 may be formed by depositing an insulating material over the resulting structure of FIGS. 4A and 4B, and by performing a planarization process on the insulating material until upper surfaces of the first resistance variable elements 132 and the fifth to the seventh conductive contacts 134, 136 and 138 are exposed.

Then, fifth to seventh conductive patterns 144, 146 and 148 which are connected with the fifth to seventh conductive contacts 134, 136 and 138, respectively, are formed. The fifth to the seventh conductive patterns 144, 146 and 148 may be formed by forming a conductive layer over the second interlayer insulating layer 140 and patterning the conductive layer.

The fifth conductive patterns 144 may have a line shape and extend in the second direction to cross the array region A, thereby overlapping with the first resistance variable elements 132 in the second direction to be electrically connected with the first resistance variable elements 132. End portions of the fifth conductive patterns 144 may be located in the outside of the array region A and overlap with the fifth conductive contacts 134, so that the end portions are electrically connected with the fifth conductive contacts 134. In this case, the fifth conductive patterns 144 may be substantially the same as the second lines L2 of the example of FIGS. 1A and 1B. Also, stacked structures including the second conductive contacts 114, the second conductive patterns 124, and the fifth conductive contacts 134, connect the fifth conductive patterns 144 to parts of the substrate 100. Therefore, the stacked structures may perform substantially the same function as the second line contacts C2 of the example of FIGS. 1A and 1B.

The sixth and the seventh conductive patterns 146 and 148 may have an island shape and overlap with the sixth and the seventh conductive contacts 136 and 138, respectively. In an embodiment, plane areas of the sixth and the seventh conductive patterns 146 and 148 may be larger than those of the sixth and the seventh conductive contacts 136 and 138, respectively.

Figure 6A:
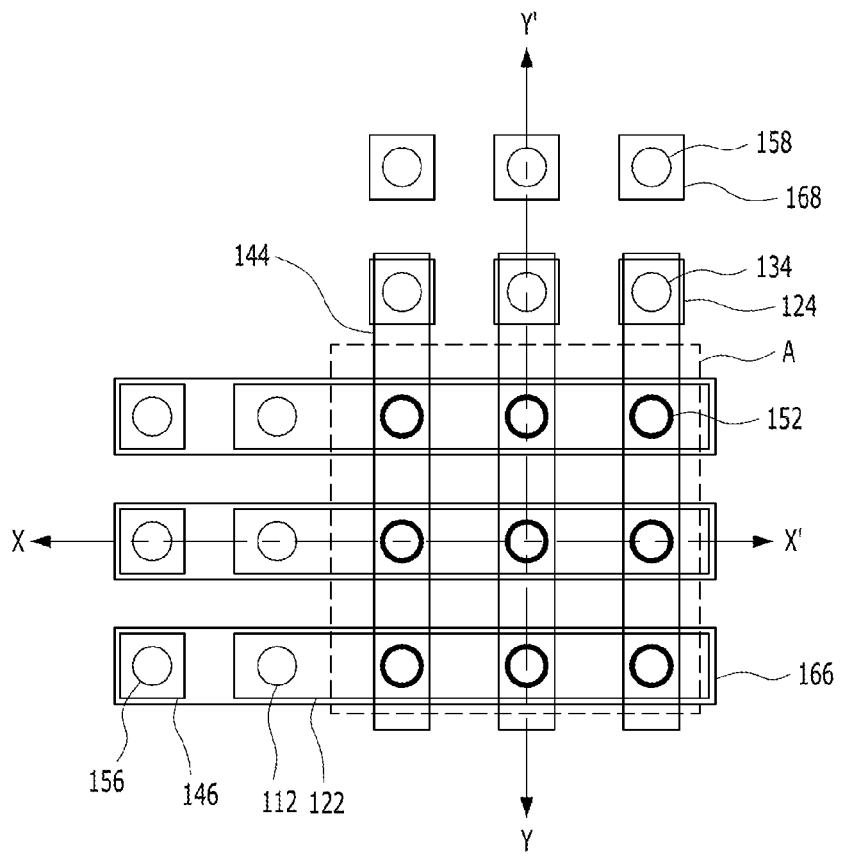
Figure 6B:
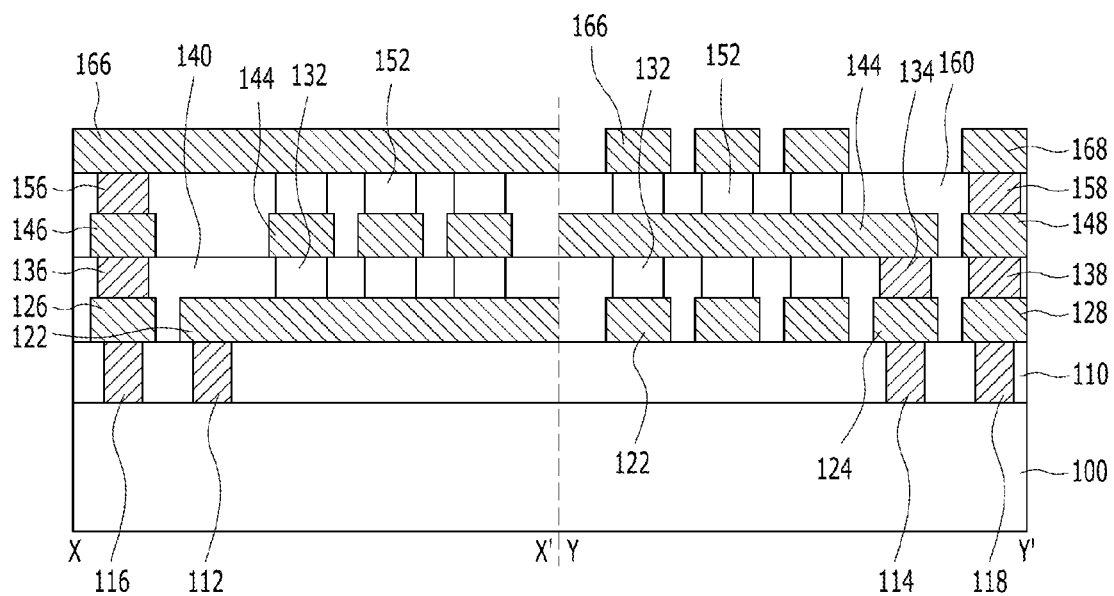

Referring to FIGS. 6A and 6B, second resistance variable elements 152 having an island shape are formed over the fifth conductive patterns 144, and eighth and ninth conductive contacts 156 and 158 are formed over the sixth and the seventh conductive patterns 146 and 148, respectively. The second resistance variable elements 152 may be disposed at intersections of the fifth conductive patterns 144 and eighth conductive patterns 166 (or third lines) as will be described below.

Processes for forming the second resistance variable elements 152 and the eighth and the ninth conductive contacts 156 and 158 are substantially the same as described above. That is, the second resistance variable elements 152 and the eighth and the ninth conductive contacts 156 and 158 may be formed by forming the second resistance variable elements 152 over the fifth to the seventh conductive patterns 144, 146 and 148, and then by performing impurity doping into the second resistance variable elements 152 disposed over the sixth and the seventh conductive patterns 146 and 148. As a result, the second resistance variable elements 152 disposed over the sixth and the seventh conductive patterns 146 and 148 are converted into conductive materials.

A third interlayer insulating layer 160 which fills a space formed between the fifth to the seventh conductive patterns 144, 146 and 148, the second resistance variable elements 152, and the eighth and the ninth conductive contacts 156 and 158.

Then, the eighth and ninth conductive patterns 166 and 168 which are connected with the eighth and the ninth conductive contacts 156 and 158, respectively, are formed by forming a conductive layer over the third interlayer insulating layer 160 and patterning the conductive layer.

The eighth conductive patterns 166 may have a line shape and extend in the first direction to cross the array region A, thereby overlapping with the second resistance variable elements 152 in the first direction to be electrically connected with the second resistance variable elements 152. End portions of the eighth conductive patterns 166 may be located in the outside of the array region A and overlap with the eighth conductive contacts 156, so that the end portions are electrically connected with the eighth conductive contacts 156. In this case, the eighth conductive patterns 166 may be substantially the same as the third lines L3 of the example of FIGS. 1A and 1B. Also, stacked structures including the third conductive contacts 116, the third conductive patterns 126, the sixth conductive contacts 136, the sixth conductive patterns 146 and the eighth conductive contacts 156, connect the eighth conductive patterns 166 to parts of the substrate 100.

Therefore, the stacked structures may perform substantially the same function as the third line contacts C3 of the example of FIGS. 1A and 1B.

The ninth conductive patterns 168 may have an island shape and overlap with the ninth conductive contacts 158. Plane areas of the ninth conductive patterns 168 may be larger than those of the ninth conductive contacts 158.

Figure 7A:
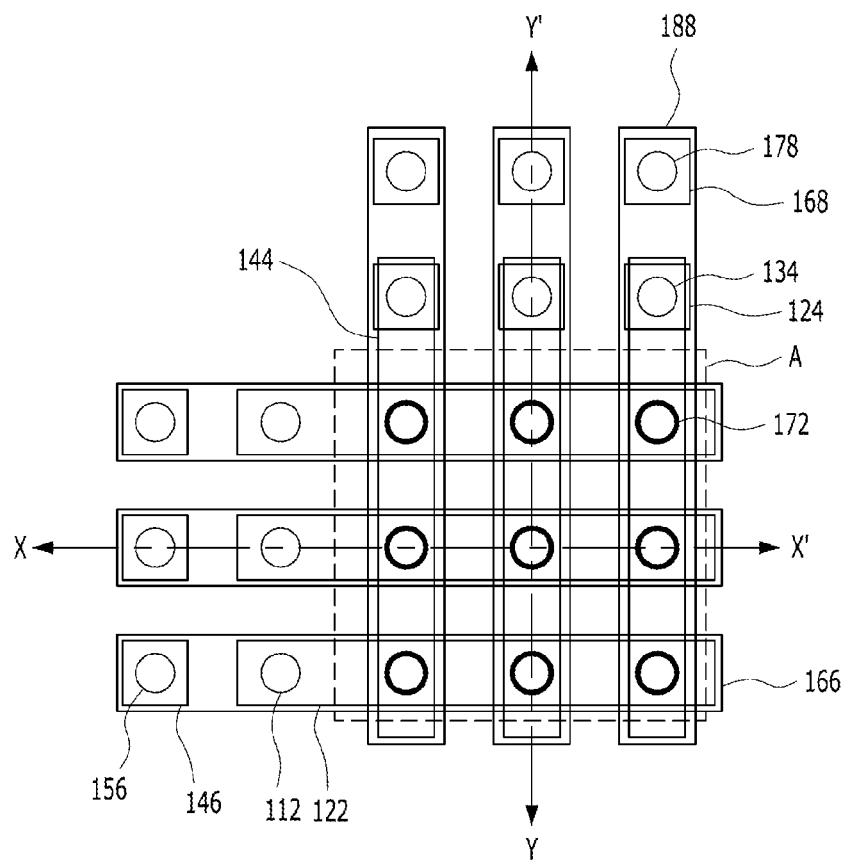
Figure 7B:
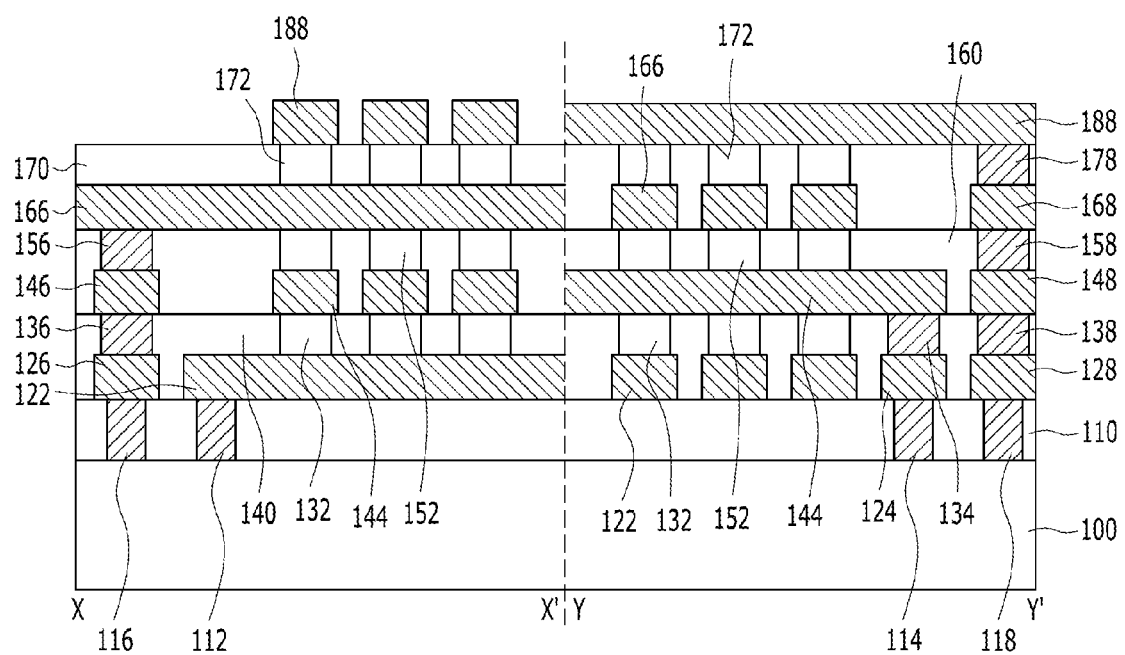

Referring to FIGS. 7A and 7B, third resistance variable elements 172 having an island shape are formed over the eighth conductive patterns 166, and tenth conductive contacts 178 are formed over the ninth conductive patterns 168. The third resistance variable elements 172 may be disposed at intersections of the eighth conductive patterns 166 and tenth conductive patterns 188 (or fourth lines as will be described below).

Processes for forming the third resistance variable elements 172 and the tenth conductive contacts 178 are substantially the same as described above. Therefore, detailed descriptions will be omitted.

A fourth interlayer insulating layer 170 fills a space formed between the eighth and the ninth conductive patterns 166 and 168, the third resistance variable elements 172, and the tenth conductive contacts 178.

Then, the tenth conductive patterns 188 which are connected with the tenth conductive contacts 178 are formed by forming a conductive layer over the fourth interlayer insulating layer 170 and patterning the conductive layer.

The tenth conductive patterns 188 may have a line shape and extend in the second direction to cross the array region A, thereby overlapping with the third resistance variable elements 172 in the second direction to be electrically connected with the third resistance variable elements 172. End portions of the tenth conductive patterns 188 may be located in the outside of the array region A and overlap with the tenth conductive contacts 178, so that the end portions are electrically connected with the tenth conductive contacts 178. In this case, the tenth conductive patterns 188 may be substantially the same as the fourth lines L4 of the example of FIGS. 1A and 1B. Also, stacked structures including the fourth conductive contacts 118, the fourth conductive patterns 128, the seventh conductive contacts 138, the seventh conductive patterns 148, the ninth conductive contacts 158, the ninth conductive patterns 168 and the tenth conductive contacts 178, connect the tenth conductive patterns 188 to parts of the substrate 100. Therefore, the stacked structures may perform substantially the same function as the fourth line contacts C4 of the example of FIGS. 1A and 1B.

Using the above described method, the semiconductor device illustrated in FIGS. 7A and 7B may be fabricated.

Referring to FIGS. 7A and 7B, the first cross-point structure includes the first lines 122 extending in the first direction, the second lines 144 extending in the second direction and disposed over the first lines 122, and the first resistance variable elements 132 disposed between the first lines 122 and the second lines 144 at intersections of the first lines 122 and the second lines 144. The first cross-point structure may be disposed over the substrate 100 and in the array region A. The end portions of the first lines 122 extending to the outside of the array region A may be connected with the substrate 100 through the first conductive contacts 112. The end portions of the second lines 144 extending to the outside of the array region A may be connected with the substrate 100 through stacked structures including the second conductive contacts 114, the second conductive patterns 124 and the fifth conductive contacts 134.

The second cross-point structure includes the second lines 144 extending in the second direction, the third lines 166 extending in the first direction and disposed over the second lines 144, and the second resistance variable elements 152 disposed between the second lines 144 and the third lines 166 at intersections of the second lines 144 and the third lines 166. The second cross-point structure may be disposed over the first cross-point structure. The end portions of the third lines 166 extending to the outside of the array region A may protrude more than the end portions of the first lines 122. The end portions of the third lines 166 may be connected with the substrate 100 through stacked structures including the third conductive contacts 116, the third conductive patterns 126, the sixth conductive contacts 136, the sixth conductive patterns 146 and the eighth conductive contacts 156.

The third cross-point structure includes the third lines 166 extending in the first direction, the fourth lines 188 extending in the second direction and disposed over the third lines 166, and the third resistance variable elements 172 disposed between the third lines 166 and the fourth lines 188 at intersections of the third lines 166 and the fourth lines 188. The third cross-point structure may be disposed over the second cross-point structure. The end portions of the fourth lines 188 extending to the outside of the array region A may protrude more than the end portions of the second lines 144. The end portions of the fourth lines 188 may be connected with the substrate 100 through stacked structures including the fourth conductive contacts 118, the fourth conductive patterns 128, the seventh conductive contacts 138, the seventh conductive patterns 148, the ninth conductive contacts 158, the ninth conductive patterns 168 and the tenth conductive contacts 178.

Figure 8A:
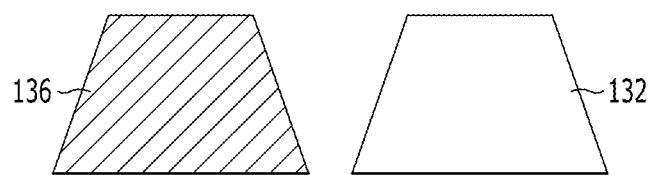
FIG. 8A is an enlarged view of the first resistance variable element and the sixth conductive contact of FIG. 7B.
Figure 8B:
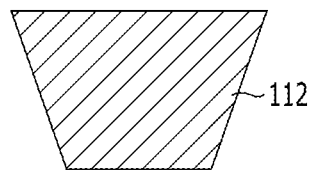
FIG. 8B is an enlarged view of the first conductive contact of FIG. 7B.

Here, since conductive contacts are formed together with resistance variable elements, the conductive contacts may have substantially the same sidewall shapes as those of the resistance variable elements. For example, referring to FIG. 8A, a width of each of the first resistance variable elements 132 may be increased from the top to the bottom surface, when the first resistance variable elements 132 are formed by depositing a resistance variable material layer and patterning the layer using dry etching. Similarly, a width of each of the sixth conductive contacts 136 may be increased from the top to the bottom surface. Although the sixth conductive contacts 136 are shown in FIG. 8A, other conductive contacts (e.g. the fifth to the tenth conductive contacts 134, 136, 138, 156, 158 and 178), which are patterned with resistance variable elements, may have substantially the same sidewall shapes as the corresponding resistance variable elements. Some conductive contacts (e.g., the first conductive contacts 112 shown in FIG. 8B) may formed by conventional processes. Specifically, the first conductive contacts 112 may be formed by conventional processes including forming contact holes by etching the first interlayer insulating layer 110 and filling the contact holes with a conductive material. When the first interlayer insulating layer 110 is etched to form the contact holes using dry etching, a width of each of the contact holes may be decreased from the top to the bottom surface. Since the first conductive contacts 112 are formed by filling the contact holes, a width of each of the first conductive contacts 112 may also be decreased from the top to the bottom surface.

The semiconductor device and the method for fabricating the same in accordance with some embodiments may offer certain benefits.

First, conductive contacts may be formed by forming resistance variable elements and performing impurity doping into some of the resistance variable elements. Therefore, processes for forming the conductive contacts are simpler than conventional processes (e.g., forming contact holes and filling the contact holes with a conductive material).

Also, since a mask pattern is used for impurity doping to form the conductive contacts, the mask pattern may have simpler and larger shapes than that used for forming small contact holes. For example, the mask pattern may have a shape covering the array region A to expose conductive contacts located outside the array region A. In this manner, masking and etching process for forming the conductive contacts becomes simpler.

Furthermore, the stacked structure (or line contact) is formed by a combination of a plurality of the conductive contacts and a plurality of the conductive patterns (or pads). The conductive contacts and the pads are formed when the resistance variable elements and lines are formed, respectively. Therefore, when forming of the resistance variable elements and the lines is completed, the stacked structures (or line contacts) that connect corresponding lines to parts of the substrate have also been formed. Since additional masking and etching processes used in fabricating the example of FIGS. 1A and 1B to form the line contacts may not be performed, processing costs and time may be reduced. In addition, although the number of the cross-point structures increase, since an etching depth for forming each of the conductive contacts and the pads is smaller than that for forming the line contacts (e.g., fourth line contact C4 in FIG. 1B), the degree of integration of the device may be increased.

Figure 9:
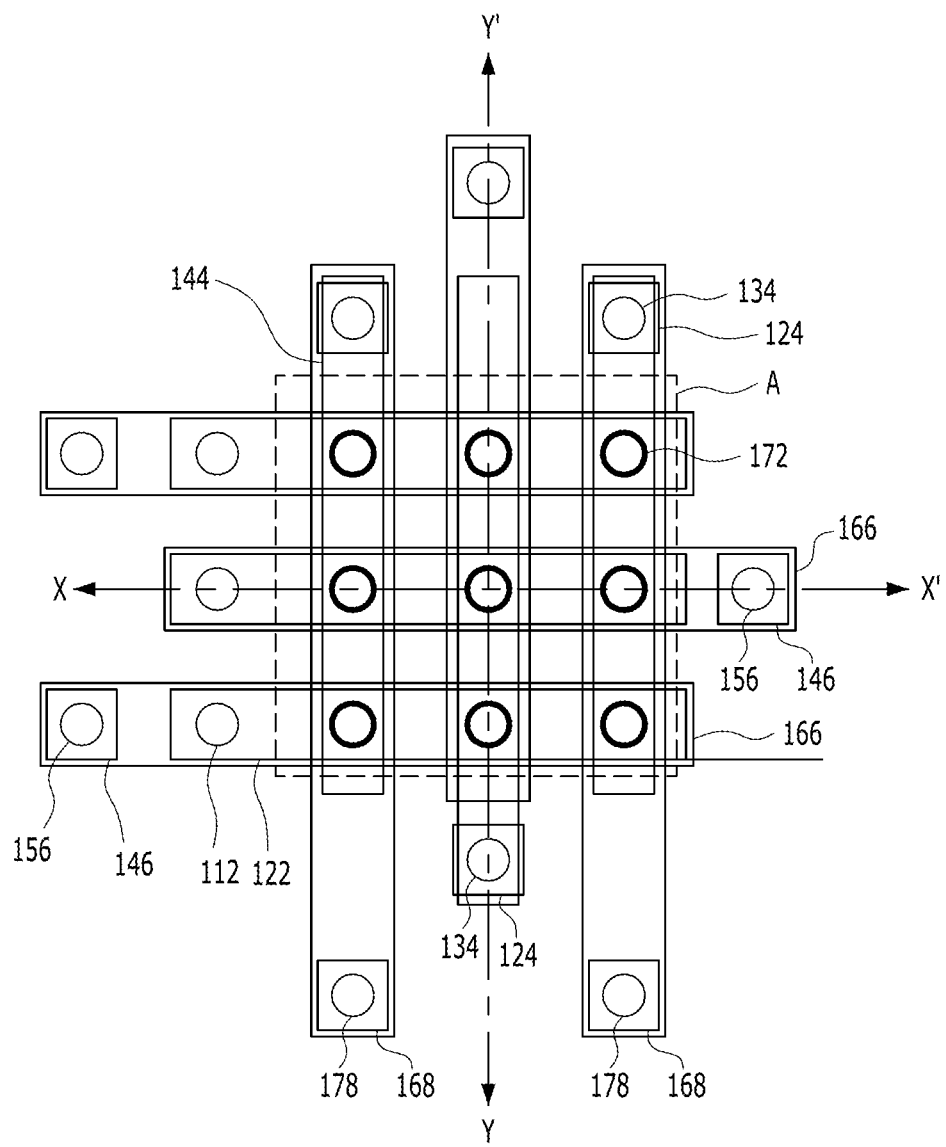
FIG. 9 is a plan view explaining a semiconductor device in accordance with an embodiment.

FIG. 9 is a plan view explaining a semiconductor device in accordance with another embodiment. The present embodiment will be described, focusing on the differences from the above-described embodiment.

Referring to FIG. 9, similarly to the above-described embodiment, end portions of second lines 144 which extend to the outside of an array region A may be connected with a substrate 100 through second stacked structures including second conductive contacts 114, second conductive patterns 124 and fifth conductive contacts 134. However, while the end portions of the second lines 144 and the second stacked structures are disposed at only one side (e.g., upper side in FIG. 6A) of the array region A in the above-described embodiment, the end portions of the second lines 144 and the second stacked structures may be disposed alternately at both sides of the array region A in the second direction in this embodiment. For instance, end portions of odd-numbered second lines 144 in the first direction and the second stacked structures connected with these end portions may be disposed at one side (e.g., upper side in FIG. 9) of the array region A. Other end portions of even-numbered second lines 144 in the first direction and the second stacked structures connected with these end portions may be disposed at the other side (e.g., lower side in FIG. 9) of the array region A.

In this case, since a distance between adjacent second conductive patterns 124 is increased, it is possible to increase a plane area of each of the second conductive patterns 124. Accordingly, a vertical alignment margin between the second conductive patterns 124 and the second and the fifth conductive contacts 114 and 134 may be increased. As a result, connecting between the second conductive patterns 124 and the second and the fifth conductive contacts 114 and 134 may be performed reliably.

Similarly, end portions of third lines 166 may be connected with the substrate 100 through third stacked structures including third conductive contacts 116, third conductive patterns 126, sixth conductive contacts 136, sixth conductive patterns 146 and eighth conductive contacts 156. The end portions of the third lines 166 and the third stacked structure may also be disposed alternately at both sides (e.g., left and right sides in FIG. 9) of the array region A in the first direction.

Similarly, end portions of fourth lines 188 may be connected with the substrate 100 through fourth stacked structures including fourth conductive contacts 118, fourth conductive patterns 128, seventh conductive contacts 138, seventh conductive patterns 148, ninth conductive contacts 158, ninth conductive patterns 168 and tenth conductive contacts 178. The end portions of the fourth lines 188 and the fourth stacked structures may be disposed alternately at both sides (e.g., upper and lower sides in FIG. 9) of the array region A in the second direction.

In this embodiment, conductive patterns of which plane areas are increased may be obtained by alternatively arranging the second to the fourth stacked structures at both sides of the array regions A. Specifically, two subsequent stacked structures respectively connected with even-numbered and odd-numbered second lines may be disposed alternately at one side (e.g., upper side in FIG. 9) and the other side (e.g., lower side in FIG. 9) of the array regions A in the second direction.

Figure 10A:
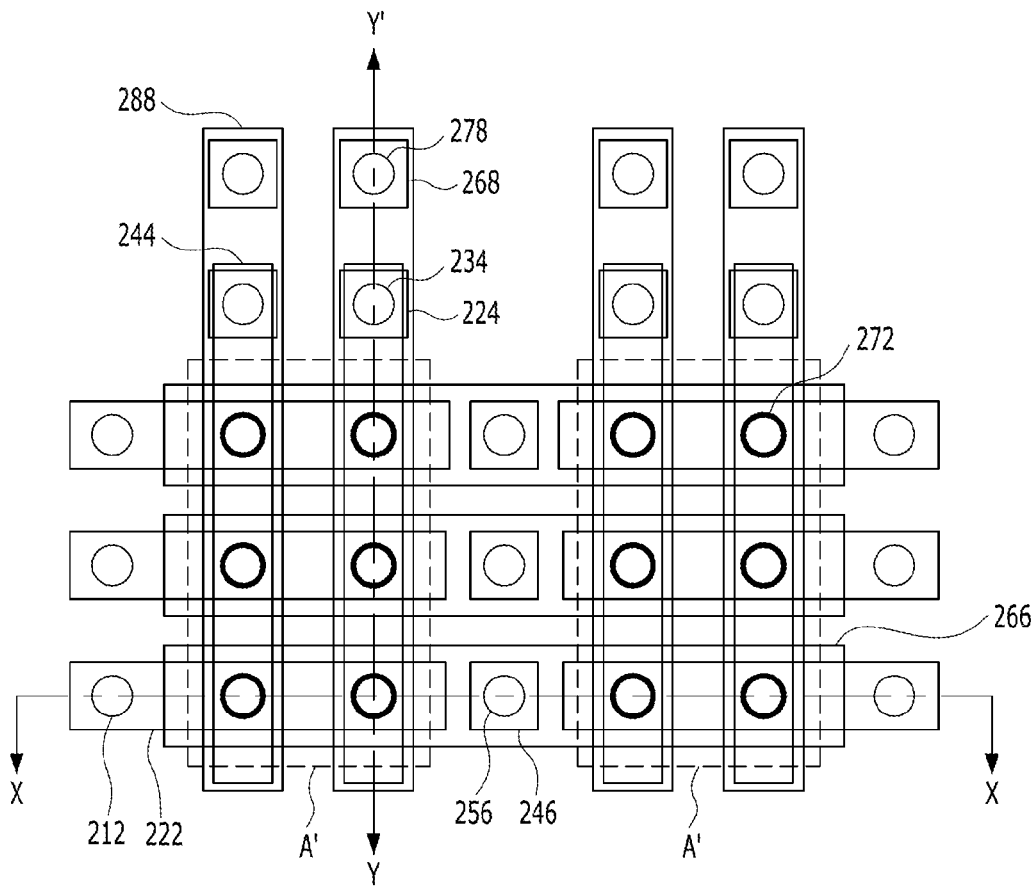
FIGS. 10A and 10B are a plan view and a cross-sectional view explaining a semiconductor device in accordance with an embodiment.
Figure 10B:
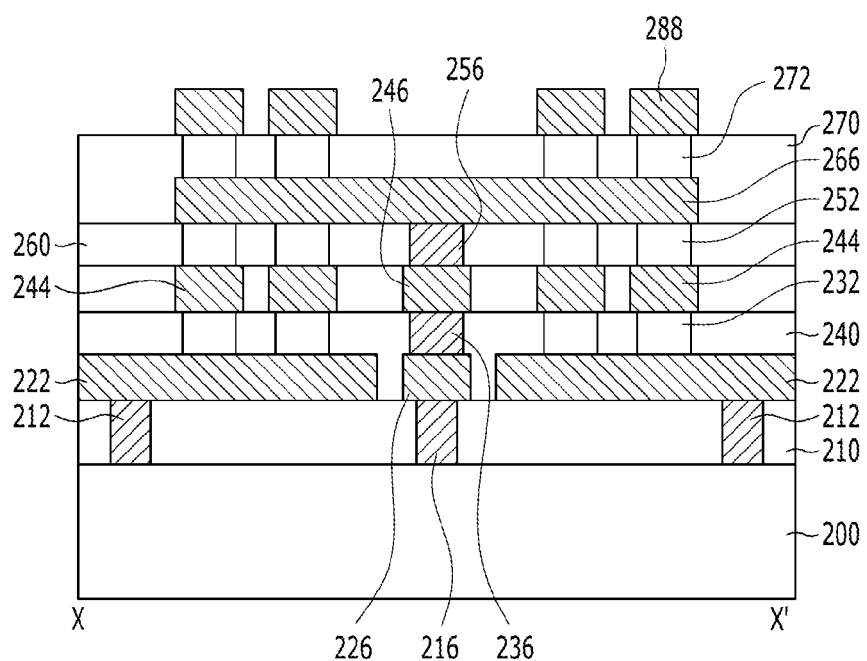

FIGS. 10A and 10B are a plan view and a cross-sectional view explaining a semiconductor device in accordance with an embodiment. This embodiment will now be described.

Referring to FIGS. 10A and 10B, two array regions A' which are separated from each other in the first direction may be defined in a substrate 200. Similarly to the above-described embodiments, at least one cross point-structure including upper lines, lower lines crossing the upper lines, and resistance variable elements interposed between the upper lines and the lower lines may be located in an array region A'.

However, in this embodiment, third stacked structures including third conductive contacts 216, third conductive patterns 226, sixth conductive contacts 236, sixth conductive patterns 246 and eighth conductive contacts 256 may be disposed between the two array regions A'. Therefore, center portions of the third lines 266 instead of end portions may be located in the outside of the array region A', and connected with the substrate 200 through the third stacked structures.

Furthermore, due to the third stacked structures disposed at a region between the two array regions A', each of first lines 222 extending in the first direction may be separated into two parts (i.e., a left part and a right part) so that neither the left nor the right part overlaps with the region between the two array regions A'. The left part crosses the left array region A' and extends towards the left side of the left array region A' to be connected with first conductive contacts 212 disposed at the left side of the left array region A'. The right part crosses the right array region A' and extends towards the right side of the right array region A' to be connected with the first conductive contacts 212 disposed at the right side of the right array region A'.

In certain embodiments, a plurality of array regions may be defined in the substrate 200, and a stacked structure including a plurality of pads and a plurality of conductive contacts may be disposed between the plurality of array regions to connect lines and parts of the substrate 200.

FIGS. 11A to 12B are a plan view and a cross-sectional view explaining a semiconductor device in accordance with an embodiment and a method for fabricating the same. This embodiment will be described, focusing on an array region A where resistance variable elements are disposed.

Figure 11A:
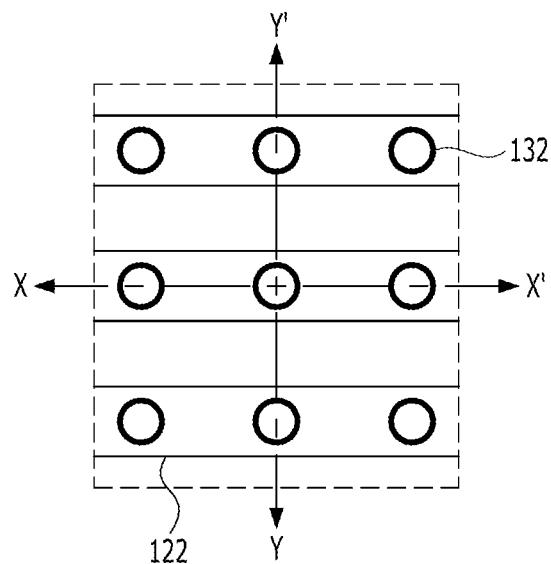
FIGS. 11A to 12B are a plan view and a cross-sectional view explaining a semiconductor device in accordance with an embodiment and a method for fabricating the same.
Figure 11B:
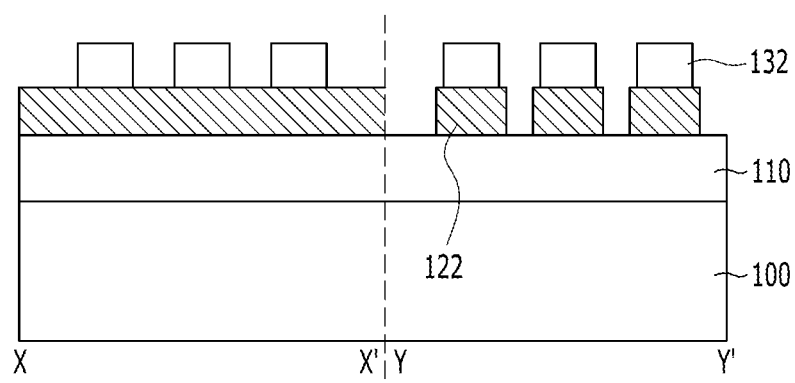

Referring to FIGS. 11A and 11B, first conductive patterns 122 extending in the first direction may be formed over a first interlayer insulating layer 110.

Then, first resistance variable elements 132 may be formed over the first conductive patterns 122.

Figure 12A:
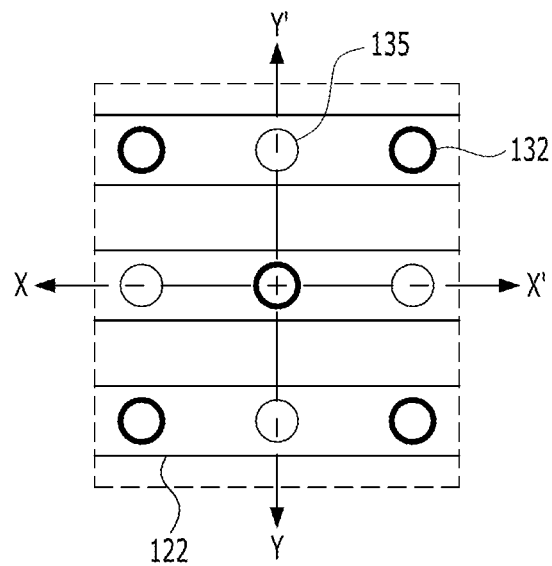
Figure 12B:
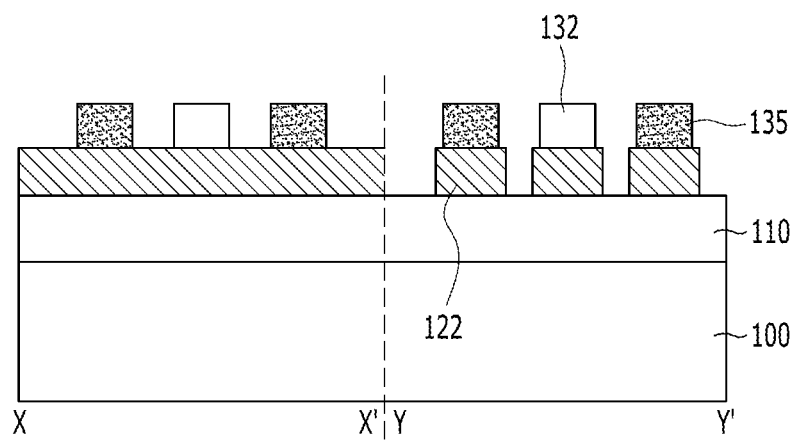

Referring to FIGS. 12A and 12B, at least one of the first resistance variable elements 132 may be changed to an insulating material by performing impurity doping. Hereinafter, the impurity-doped first resistance variable elements 132 are referred to as first insulating patterns 135. The first insulating patterns 135 may have the same shapes as the first resistance variable elements 132.

Any impurities may be used in the impurity doping if the impurities can change the first resistance variable elements 132 to the insulating material. For example, when the first resistance variable elements 132 are formed of a metal oxide, the impurity doping including an oxygen ion implantation and a plasma treatment in an oxygen-containing atmosphere or a heat treatment in an oxygen-containing atmosphere may be performed. In this case, a mask pattern is formed over the resulting structure of FIGS. 11A and 11B such that the mask pattern exposes regions where the first insulating patterns 135 are to be formed. When oxygen is implanted to the exposed first resistance variable elements 132 formed of the metal oxide, the density of oxygen vacancies in the first resistance variable elements 132 may be decreased. As a result, the first resistance variable elements 132 may lose a resistance variable characteristic and be converted into the insulating material.

Then, while not shown, fifth conductive patterns (see the reference numeral 144 of FIGS. 5A and 5B) crossing the first conductive patterns 122 may be formed over first resistance variable elements 132 and the first insulating patterns 135.

In this embodiment, at least one insulating pattern (e.g., the first insulating patterns 135) may be disposed at least one of intersections of upper lines (e.g., the fifth conductive patterns 144 of FIGS. 5A and 5B) and lower lines (e.g., the first conductive patterns 122), in the array region A. Since the insulating pattern prevents a current from flowing through the insulating pattern, the amount of leakage currents through a cross-point structure including the upper lines, the lower lines, and the remaining resistance variable elements may be reduced by controlling the number and the position of the insulating pattern.

Figure 13:
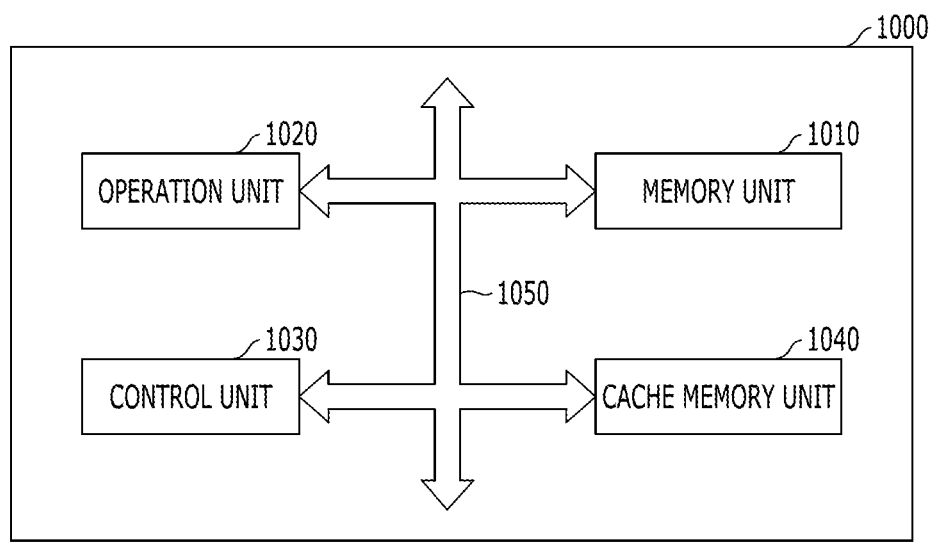
FIG. 13 is a block diagram of a microprocessor in accordance with an embodiment.

FIG. 13 is a block diagram of a microprocessor in accordance with an embodiment.

Referring to FIG. 13, a microprocessor 1000 may perform tasks for controlling and tuning a series of processes of receiving data from various external devices, processing the data, and outputting processing results to external devices. The microprocessor 1000 may include a memory unit 1010, an operation unit 1020 and a control unit 1030. The microprocessor 1000 may be various types of processing units such as a central processing unit (CPU), a graphic processing unit (GPU), a digital signal processor (DSP) and an application processor (AP).

The memory unit 1010 is a part which stores data in the microprocessor 1000, as a processor register or a register. The memory unit 1010 may include a data register, an address register and a floating point register. In addition, the memory unit 1010 may include various registers. The memory unit 1010 may perform the function of temporarily storing data for which operations are to be performed by the operation unit 1020, result data from performing the operations and an address where data for performing of the operations are stored.

The memory unit 1010 may include one of the above-described semiconductor devices. The memory unit 1010 including a semiconductor device as described herein may include a first conductive pattern; a second conductive pattern disposed over the first conductive pattern; a resistance variable element interposed between the first conductive pattern and the second conductive pattern; a first pad which is provided on the same plane as the first conductive pattern; and a conductive contact disposed over the first pad, wherein the conductive contact is provided on the same plane as the resistance variable element and has substantially the same sidewall shape as the resistance variable element. Through this, a fabrication process of the memory unit 1010 may be easy and simple and the degree of integration of the memory unit 1010 may be increased. As a consequence, a fabrication process of the microprocessor 1000 may be simplified and the degree of the integration of the microprocessor 1000 may be increased.

The operation unit 1020 is a part which performs operations in the microprocessor 1000. The operation unit 1020 performs arithmetical operations or logical operations according to signals transmitted from the control unit 1030. The operation unit 1020 may include at least one arithmetic logic unit (ALU).

The control unit 1030 receives signals from the memory unit 1010, the operation unit 1020 and an external device of the microprocessor 1000, performs extraction, decoding and controlling upon input and output of commands, and executes processing represented by programs.

The microprocessor 1000 according to the present embodiment may additionally include a cache memory unit 1040 which can temporarily store data to be inputted from an external device or to be outputted to an external device. In this case, the cache memory unit 1040 may exchange data with the memory unit 1010, the operation unit 1020 and the control unit 1030 through a bus interface 1050.

Figure 14:
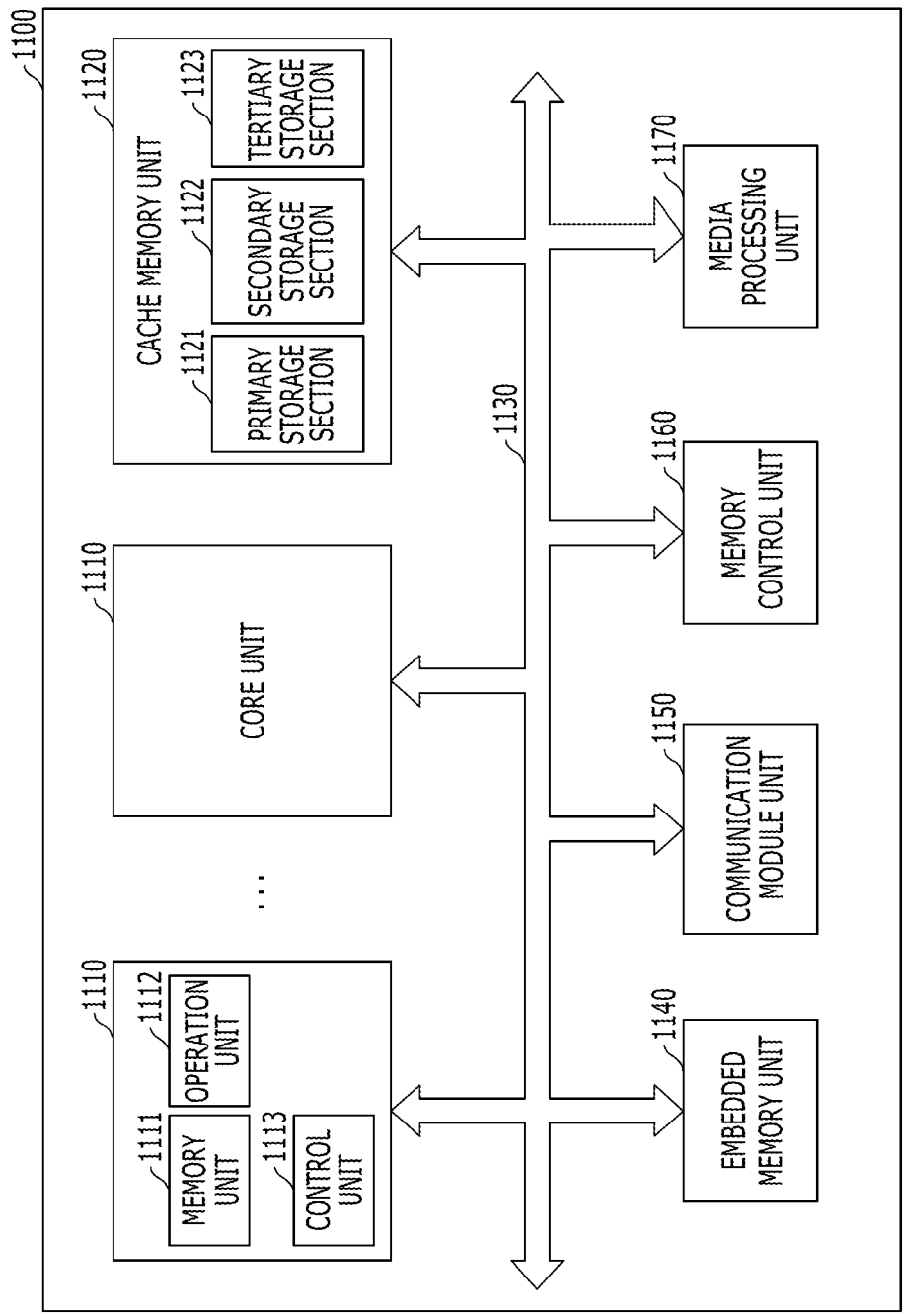
FIG. 14 is a block diagram of a processor in accordance with an embodiment.

FIG. 14 is a block diagram of a processor in accordance with an embodiment.

Referring to FIG. 14, a processor 1100 may improve performance and realize multi-functionality by including various functions in addition to controlling and tuning a series of processes of receiving data from various external devices, processing the data, and outputting processing results to external devices. The processor 1100 may include a core unit 1110, a cache memory unit 1120, and a bus interface 1130. The core unit 1110 is a part which performs arithmetic logic operations for data inputted from an external device, and may include a memory unit 1111, an operation unit 1112 and a control unit 1113. The processor 1100 may be various system-on-chips (SoCs) such as a multi-core processor, a graphic processing unit (GPU) and an application processor (AP).

The memory unit 1111 is a component which stores data in the processor 1100, as a processor register or a register. The memory unit 1111 may include a data register, an address register and a floating point register. In addition, the memory unit 1111 may include various registers. The memory unit 1111 may perform the function of temporarily storing (i) data for which operations are to be performed by the operation unit 1112, (ii) result data obtained by performing the operations and (iii) an address where data for performing of the operations are stored. The operation unit 1112 is a component which performs operations in the processor 1100. The operation unit 1112 performs arithmetical operations or logical operations in response to signals from the control unit 1113. The operation unit 1112 may also include at least one arithmetic logic unit (ALU). The control unit 1113 receives signals from the memory unit 1111, the operation unit 1112, and an external device of the processor 1100, performs extraction, decoding, controlling upon input and output of commands, and executes processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122, and a tertiary storage section 1123. In general, the cache memory unit 1120 includes the primary and secondary storage sections 1121 and 1122, and may include the tertiary storage section 1123 when high storage capacity is desired. When appropriate, the cache memory unit 1120 may include an increased number of storage sections. That is to say, the number of storage sections which are included in the cache memory unit 1120 may be changed according to a chip design. The speeds at which the primary, secondary, and tertiary storage sections 1121, 1122 and 1123 store and discriminate data may be substantially the same or different. In the case where the speeds of the respective storage sections 1121, 1122 and 1123 are different, the speed of the primary storage section 1121 may be set to be the fastest. At least one storage section of the primary storage section 1121, the secondary storage section 1122, and the tertiary storage section 1123 of the cache memory unit 1120 may include one of the above-described semiconductor devices. The cache memory unit 1120 including the semiconductor device in accordance with an embodiment may include a first conductive pattern; a second conductive pattern disposed over the first conductive pattern; a resistance variable element interposed between the first conductive pattern and the second conductive pattern; a first pad which is provided on the same plane as the first conductive pattern; and a conductive contact disposed over the first pad, wherein the conductive contact is provided on the same plane as the resistance variable element and has substantially the same sidewall shape as the resistance variable element. Through this, a fabrication process of the memory unit 1010 may be simplified and the degree of integration of memory unit 1010 may be increased. Through this, a fabrication process of the cache memory unit 1120 may be easy and simple and the degree of integration of the cache memory unit 1120 may be increased. As a consequence, a fabrication process of the processor 1100 may be simplified and the degree of integration of the processor 1100 may be increased.

Although it was shown in FIG. 9 that all the primary, secondary, and tertiary storage sections 1121, 1122 and 1123 are configured inside the cache memory unit 1120, the embodiments are not limited thereto. For example, it is to be noted that all the primary, secondary, and tertiary storage sections 1121, 1122 and 1123 of the cache memory unit 1120 may be configured outside the core unit 1110 and may compensate for a difference in data processing speed between the core unit 1110 and the external device. For another example, the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed.

The bus interface 1130 is a part which connects the core unit 1110 and the cache memory unit 1120 for effective transmission of data.

As shown in FIG. 14, the processor 1100 according to an embodiment may include a plurality of core units 1110, and the plurality of core units 1110 may share the same cache memory unit 1120. The plurality of core units 1110 and the cache memory unit 1120 may be connected through the bus interface 1130. The plurality of core units 1110 may be configured in substantially the same way as the above-described configuration of the core unit 1110. In the case where the processor 1100 includes the plurality of core units 1110, the primary storage section 1121 of the cache memory unit 1120 may be configured in each core unit 1110, and the secondary storage section 1122 and the tertiary storage section 1123 may be configured outside the plurality of core units 1110 in such a way as to be shared through the bus interface 1130.

In an embodiment, the processing speed of the primary storage section 1121 may be faster than the processing speeds of the secondary and tertiary storage section 1122 and 1123.

The processor 1100 may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device. In addition, the processor 1100 may include a plurality of modules. In this case, the plurality of modules which are added may exchange data with the core units 1110, the cache memory unit 1120, and other units, through the bus interface 1130.

The embedded memory unit 1140 may include not only a volatile memory but also a nonvolatile memory. The volatile memory may include a dynamic random access memory (DRAM), a mobile DRAM, a static random access memory (SRAM), and the like. The nonvolatile memory may include a read only memory (ROM), a NOR flash memory, a NAND flash memory, a phase change random access memory (PRAM), a resistive random access memory (RRAM), a spin transfer torque random access memory (STTRAM), a magnetic magneto-resistive random access memory (MRAM), and the like.

The communication module unit 1150 may include both a module capable of being connected with a wired network and a module capable of being connected with a wireless network. The wired network module may include a local area network (LAN), a universal serial bus (USB), an Ethernet, power line communication (PLC), and the like. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), and the like.

The memory control unit 1160 is to administrate data transmitted between the processor 1100 and an external storage device operating according to a different communication standard. The memory control unit 1160 may include various memory controllers, for example, controllers for controlling IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and the like.

The media processing unit 1170 processes the data processed in the processor 1100 or the data inputted from the external input device and output the processed data to the external interface device to be transmitted in the forms of image, voice and others, and may include a graphic processing unit (GPU), a digital signal processor (DSP), a high definition audio (HD audio), a high definition multimedia interface (HDMI) controller, and the like.

Figure 15:
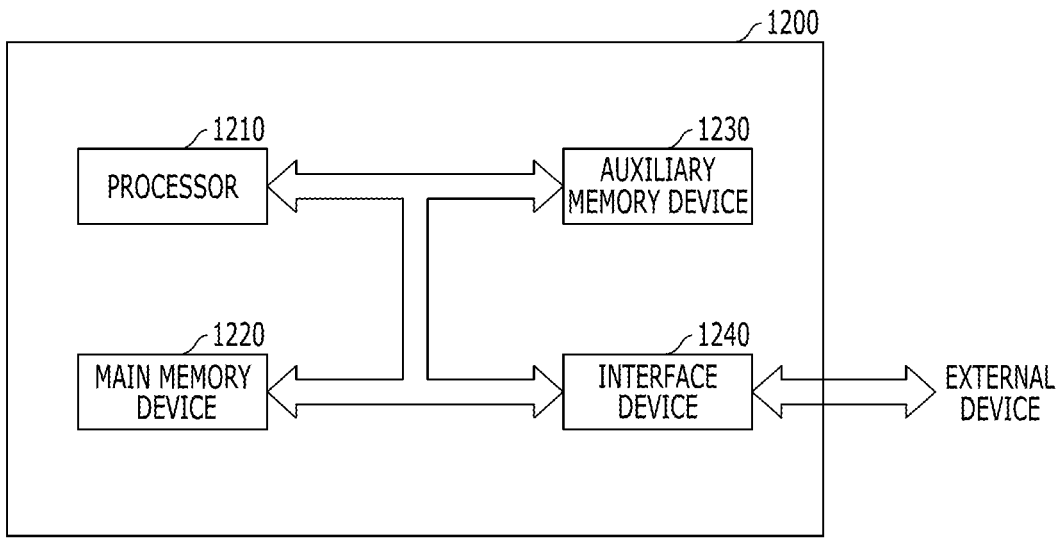
FIG. 15 is a block diagram of a system in accordance with an embodiment.

FIG. 15 is a block diagram of a system in accordance with an embodiment.

Referring to FIG. 15, a system 1200 as an apparatus for processing data may perform input, processing, output, communication, storage, etc. to conduct a series of manipulations on data. The system 1200 may include a processor 1210, a main memory device 1220, an auxiliary memory device 1230, and an interface device 1240. The system 1200 may comprise one of various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and the like.

The processor 1210 controls decoding of inputted commands and processing such as operation, comparison, etc. for the data stored in the system 1200, and may comprise a microprocessor unit (MPU), a central processing unit (CPU), a single/multi-core processor, a graphic processing unit (GPU), an application processor (AP), a digital signal processor (DSP), and the like.

The main memory device 1220 is a memory which can call and execute programs or data from the auxiliary memory device 1230 when programs are executed and can conserve memorized contents even when power supply is cut off. The main memory device 1220 may include one of the above-described semiconductor devices. The main memory device 1220 including a semiconductor device as described herein may include a first conductive pattern; a second conductive pattern disposed over the first conductive pattern; a resistance variable element interposed between the first conductive pattern and the second conductive pattern; a first pad which is provided on the same plane as the first conductive pattern; and a conductive contact disposed over the first pad, wherein the conductive contact is provided on the same plane as the resistance variable element and has substantially the same sidewall shape as the resistance variable element. Through this, a fabrication process of the main memory device 1220 may be simplified and the degree of integration of the main memory device 1220 may be increased. Also, the main memory device 1220 may further include a volatile memory such as a static random access memory (SRAM), a dynamic random access memory (DRAM), and the like in which all contents are erased when power supply is cut off. Unlike this, the main memory device 1220 may not include the semiconductor devices according to the embodiments, but may include a static random access memory (SRAM), a dynamic random access memory (DRAM), and the like, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one of the above-described semiconductor devices in accordance with the embodiments. The auxiliary memory device 1230 including the semiconductor device in accordance with the aforementioned embodiment may include a first conductive pattern; a second conductive pattern disposed over the first conductive pattern; a resistance variable element interposed between the first conductive pattern and the second conductive pattern; a first pad which is provided on the same plane as the first conductive pattern; and a conductive contact disposed over the first pad, wherein the conductive contact is provided on the same plane as the resistance variable element and has substantially the same sidewall shape as the resistance variable element. Through this, a fabrication process of the auxiliary memory device 1230 may be simplified and the degree of integration of the auxiliary memory device 1230 may be increased. As a consequence, a fabrication process of the system 1200 may be simplified and the degree of integration of the system 1200 may be increased.

Also, the auxiliary memory device 1230 may further include a data storage system (see the reference numeral 1300 of FIG. 16) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and the like. Unlike this, the auxiliary memory device 1230 may not include the semiconductor devices according to the embodiments, but may include data storage systems (see the reference numeral 1300 of FIG. 16) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and the like.

The interface device 1240 may be to perform exchange of commands and data between the system 1200 of the present embodiment and an external device. The interface device 1240 may be a keypad, a keyboard, a mouse, a speaker, a mike, a display, various human interface devices (HIDs), and a communication device. The communication device may include both a module capable of being connected with a wired network and a module capable of being connected with a wireless network. The wired network module may include a local area network (LAN), a universal serial bus (USB), an Ethernet, power line communication (PLC), and the like. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), and the like.

Figure 16:
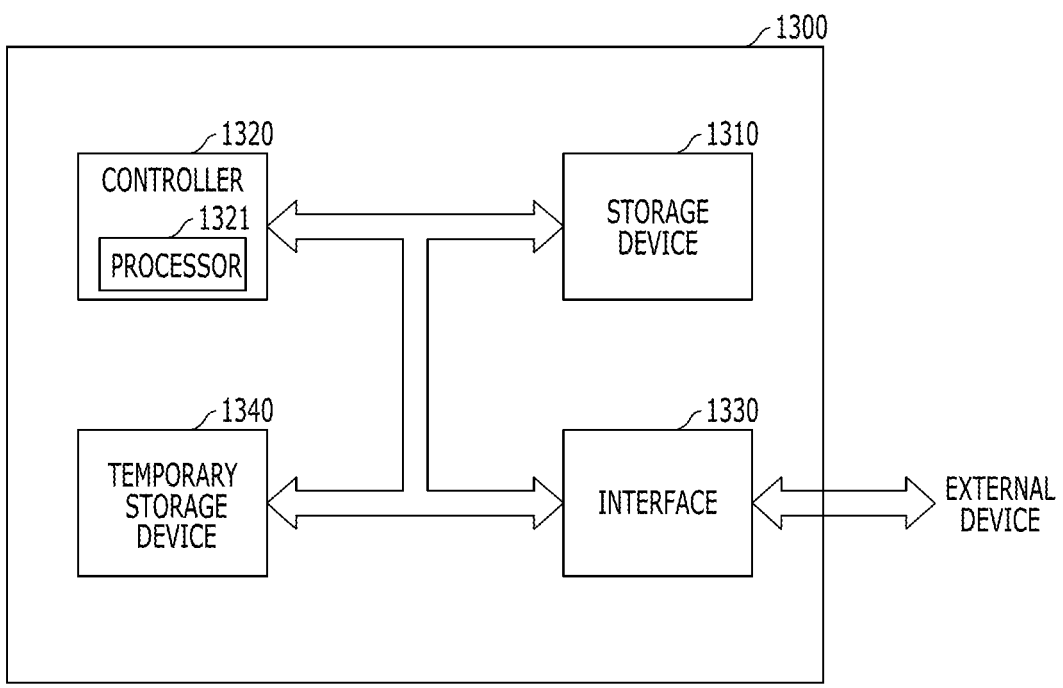
FIG. 16 is a block diagram of a data storage system in accordance with an embodiment.

FIG. 16 is a block diagram of a data storage system in accordance with an embodiment.

Referring to FIG. 16, a data storage system 1300 may include a storage device 1310 which has a nonvolatile characteristic as a component for storing data, a controller 1320 which controls the storage device 1310, and an interface 1330 for connection with an external device. The data storage system 1300 may be a disk type such as a hard disk drive (HDD), a compact disc read only memory (CDROM), a digital versatile disc (DVD), a solid state disk (SSD), and the like, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and the like.

The controller 1320 may control exchange of data between the storage device 1310 and the interface 1330. To this end, the controller 1320 may include a processor 1321 for performing an operation for and processing commands inputted through the interface 1330 from an outside of the data storage system 1300.

The interface 1330 is to perform exchange of commands and data between the data storage system 1300 and the external device. In the case where the data storage system 1300 is a card type, the interface 1330 may be an interface which is compatible with a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so the like. In the case where the data storage system 1300 is a disk type, the interface 1330 may be an interface which is compatible with IDE (Integrated Device Electronics), SATA (Serial Advanced Technology Attachment), SCSI (Small Computer System Interface), eSATA (External SATA), PCM-CIA (Personal Computer Memory Card International Association), a USB (universal serial bus), and the like The data storage system 1300 according to the present embodiment may further include a temporary storage device 1340 for efficiently transferring data between the interface 1330 and the storage device 1310 according to diversification and high performance of an interface with an external device, a controller and a system. The storage device 1310 and the temporary storage device 1340 for temporarily storing data may include one of the above-described semiconductor devices in accordance with the embodiments. The storage device 1310 or the temporary storage device 1340 including a semiconductor device as described herein may include a first conductive pattern; a second conductive pattern disposed over the first conductive pattern; a resistance variable element interposed between the first conductive pattern and the second conductive pattern; a first pad which is provided on the same plane as the first conductive pattern; and a conductive contact disposed over the first pad, wherein the conductive contact is provided on the same plane as the resistance variable element and has substantially the same sidewall shape as the resistance variable element. Through this, a fabrication process of the storage device 1310 or the temporary storage device 1340 may become simplified and the degree of integration of the storage device 1310 or the temporary storage device 1340 may be increased. As a consequence, a fabrication process of the data storage system 1300 may become simplified and the reliability of the data storage system 1300 may be improved.

Figure 17:
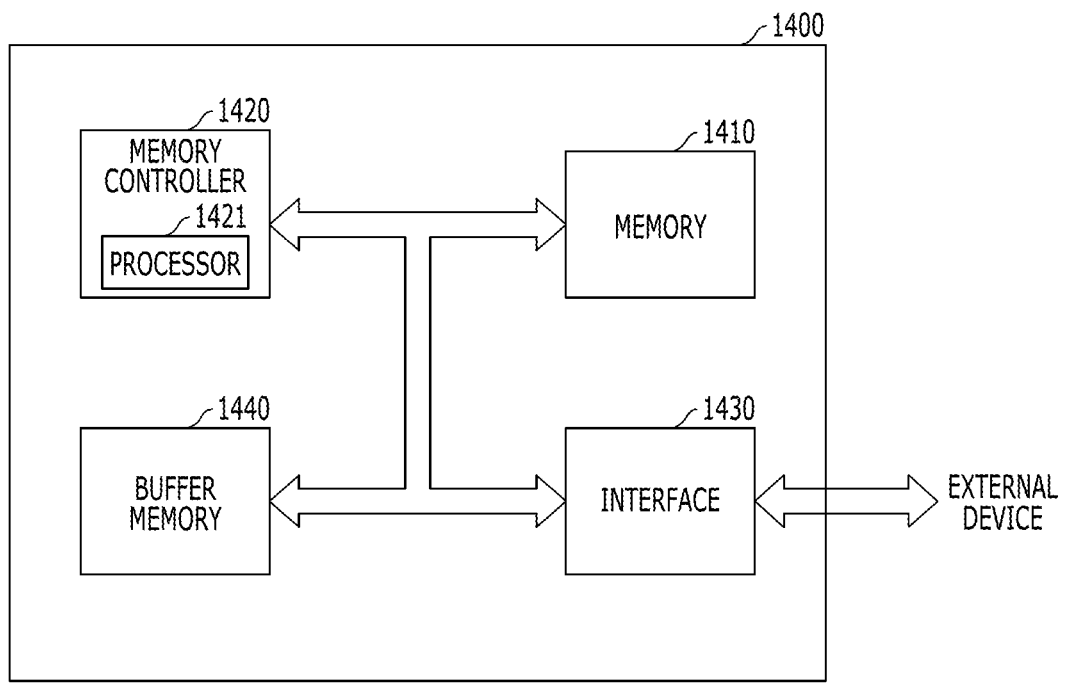
FIG. 17 is a block diagram of a memory system in accordance with an embodiment.

FIG. 17 is a block diagram of a memory system in accordance with an embodiment.

Referring to FIG. 17, a memory system 1400 may include a memory 1410 which has a nonvolatile characteristic as a component for storing data, a memory controller 1420 which controls the memory 1410, and an interface 1430 for connection with an external device. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and the like.

The memory 1410 for storing data may include one of the above-described semiconductor devices in accordance with the embodiments. The memory 1410 including a semiconductor device as described herein may include a first conductive pattern; a second conductive pattern disposed over the first conductive pattern; a resistance variable element interposed between the first conductive pattern and the second conductive pattern; a first pad which is provided on the same plane as the first conductive pattern; and a conductive contact disposed over the first pad, wherein the conductive contact is provided on the same plane as the resistance variable element and has substantially the same sidewall shape as the resistance variable element. Through this, a fabrication process of the memory 1410 may become simplified and the degree of integration of the memory 1410 may be increased. Also, the memory 1410 may further include a ROM (read only memory), a NOR flash memory, a NAND flash memory, a phase change random access memory (PRAM), a resistive random access memory (RRAM), a magneto-resistive random access memory (MRAM), and the like, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and the like.

The memory system 1400 may further include a buffer memory 1440 for efficiently transferring data between the interface 1430 and the memory 1410 according to diversification and high performance of an interface with an external device, a memory controller and a memory system. The buffer memory 1440 for temporarily storing data may include one of the above-described semiconductor devices in accordance with the embodiments.

The buffer memory 1440 including a semiconductor device as described herein may include a first conductive pattern; a second conductive pattern disposed over the first conductive pattern; a resistance variable element interposed between the first conductive pattern and the second conductive pattern; a first pad which is provided on the same plane as the first conductive pattern; and a conductive contact disposed over the first pad, wherein the conductive contact is provided on the same plane as the resistance variable element and has substantially the same sidewall shape as the resistance variable element. Through this, a fabrication process of the buffer memory 1440 may become simplified and the degree of integration of the buffer memory 1440 may be increased. As a consequence, a fabrication process of the memory system 1400 may become simplified and the degree of integration of the memory system 1400 may be increased.

Moreover, the buffer memory 1440 may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magneto-resistive random access memory (MRAM), and so on, which have a nonvolatile characteristic.

Unlike this, the buffer memory 1440 may not include a semiconductor device as described herein, but may include an SRAM (static random access memory), a DRAM (dynamic random access memory), and the like, which have a volatile characteristic, and a phase change random access memory (PRAM), a resistive random access memory (RRAM), a spin transfer torque random access memory (STTRAM), a magneto-resistive random access memory (MRAM), and the like, which have a nonvolatile characteristic.

As is apparent from the above descriptions, in the semiconductor device and the method for fabricating the same in accordance with embodiments of the present disclosure, processing may be simplified and the degree of integration may be increased.

Although various embodiments have been described for illustrative purposes, it will be apparent to those skilled in the art that various changes and modifications may be made without departing from the spirit and scope of the present disclosure as defined in the following claims.

What is claimed is:

1. A semiconductor device comprising:
   a substrate;
   a first conductive pattern disposed over the substrate;
   a second conductive pattern disposed over the first conductive pattern;
   a resistance variable element interposed between the first conductive pattern and the second conductive pattern and configured to switch between different resistance states to store data according to a voltage or current applied to the resistance variable element;
   a first pad disposed over the substrate, wherein a bottom surface of the first pad and a bottom surface of the first conductive pattern are disposed at a substantially same level from a top surface of the substrate; and
   a conductive contact disposed over the first pad and configured to be conductive while the data is being stored in the resistance variable element, wherein a bottom surface of the conductive contact and a bottom surface of the resistance variable element are disposed at a substantially same distance from the top surface of the substrate,
   wherein the resistance variable element includes a first metal oxide, and
   wherein the conductive contact includes a material in which a second metal is added to the first metal oxide.

2. The semiconductor device according to claim 1, wherein the conductive contact overlaps with the second conductive pattern such that the conductive contact is connected with the second conductive pattern.

3. The semiconductor device according to claim 1, further comprising:
   a second pad which overlaps with the conductive contact, wherein a bottom surface of the second pad and a bottom surface of the second conductive pattern are disposed at a substantially same distance from the top surface of the substrate.

4. The semiconductor device according to claim 1, wherein the substrate includes a first region where the resistance variable element is disposed and a second region where the first pad is disposed,
   wherein the first conductive pattern crosses the first region and extends to the second region in a first direction, and
   wherein the second conductive pattern crosses the first region and extends to the second region in a second direction crossing with the first direction.

5. The semiconductor device according to claim 4, wherein the second conductive pattern is a first line and a first stacked structure includes the first pad and the conductive contact, the semiconductor device further comprising:
   a second line disposed adjacent to the first line, the first and second lines being arranged in the first direction; and
   a second stacked structure including an additional first pad and an additional conductive contact,
   wherein the first stacked structure overlaps with the first line to connect the first stacked structure with the first line,
   wherein the second stacked structure overlaps with the second line to connect the second stacked structure with the second line, and
   wherein the first stacked structure and the second stacked structure are disposed on opposite sides of the first region in the second direction.

6. The semiconductor device according to claim 1, wherein the conductive contact is disposed directly on the first pad.

7. The semiconductor device according to claim 1, wherein the conductive contact and the resistance variable element each have a cross-sectional shape that has a width increasing from a top surface to a bottom surface thereof.

8. The semiconductor device according to claim 1, wherein the conductive contact is coupled to the resistance variable element through the second conductive pattern, and configured to provide a conductive path to apply the voltage or current to the resistance variable element.

9. The semiconductor device according to claim 1, wherein a density of oxygen vacancies of the conductive contact is greater than that of the resistance variable element.

* * * * *